United States Patent
Tanaka et al.

[11] Patent Number: 6,002,621
[45] Date of Patent: Dec. 14, 1999

[54] SEMICONDUCTOR MEMORY DEVICE

[75] Inventors: Shinji Tanaka; Koji Tanaka; Mikio Asakura; Kenichi Yasuda, all of Tokyo, Japan

[73] Assignee: Mitsubishi Denki Kabushiki Kaisha, Tokyo, Japan

[21] Appl. No.: 09/033,657

[22] Filed: Mar. 3, 1998

Related U.S. Application Data

[63] Continuation-in-part of application No. 08/852,643, May 7, 1997, Pat. No. 5,781,484.

[30] Foreign Application Priority Data

Dec. 12, 1996 [JP] Japan .................................. 8-332064
Aug. 8, 1997 [JP] Japan .................................. 9-214676

[51] Int. Cl.[6] ........................................... G11C 7/00
[52] U.S. Cl. ........................................... 365/200; 365/201
[58] Field of Search ........................... 365/200, 201, 365/189.07, 230.06

[56] References Cited

U.S. PATENT DOCUMENTS

| | | | |
|---|---|---|---|
| 5,416,740 | 5/1995 | Fujita et al. | 365/200 |
| 5,566,128 | 10/1996 | Magome | 365/200 X |
| 5,596,536 | 1/1997 | Koh | 365/200 |
| 5,617,364 | 4/1997 | Hatakeyama | 365/200 |
| 5,781,484 | 7/1998 | Tanaka et al. | 365/200 |

*Primary Examiner*—Do Hyun Yoo
*Attorney, Agent, or Firm*—Oblon, Spivak, McClelland, Maier & Neustadt, P.C.

[57] ABSTRACT

Normal column selection signal switching device (20) is provided to switch a signal outputted from normal column selection signal generating device (19) in response to a test-mode signal (TMC1). Even if the normal column selection signal generating device (19) outputs a signal to disable a normal column decoder (3), the normal column selection signal switching device (20) switches the signal to enable the normal column decoder (3) to operate in the test operation. Having this configuration, a semiconductor memory device enables writing of data into all the normal memory cells even after some of the normal memory cells are replaced by spare memory cells.

6 Claims, 15 Drawing Sheets

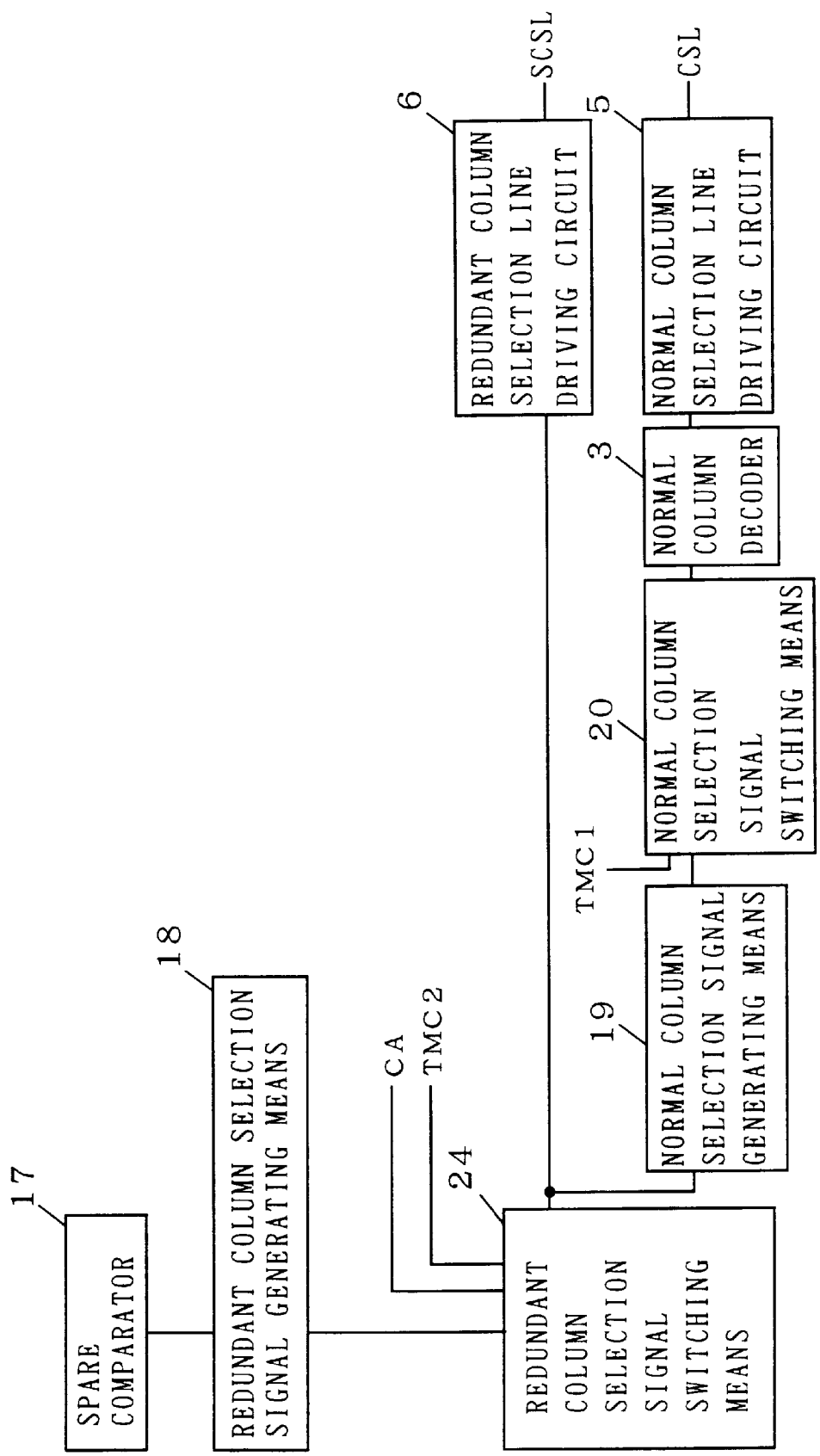
F I G. 5

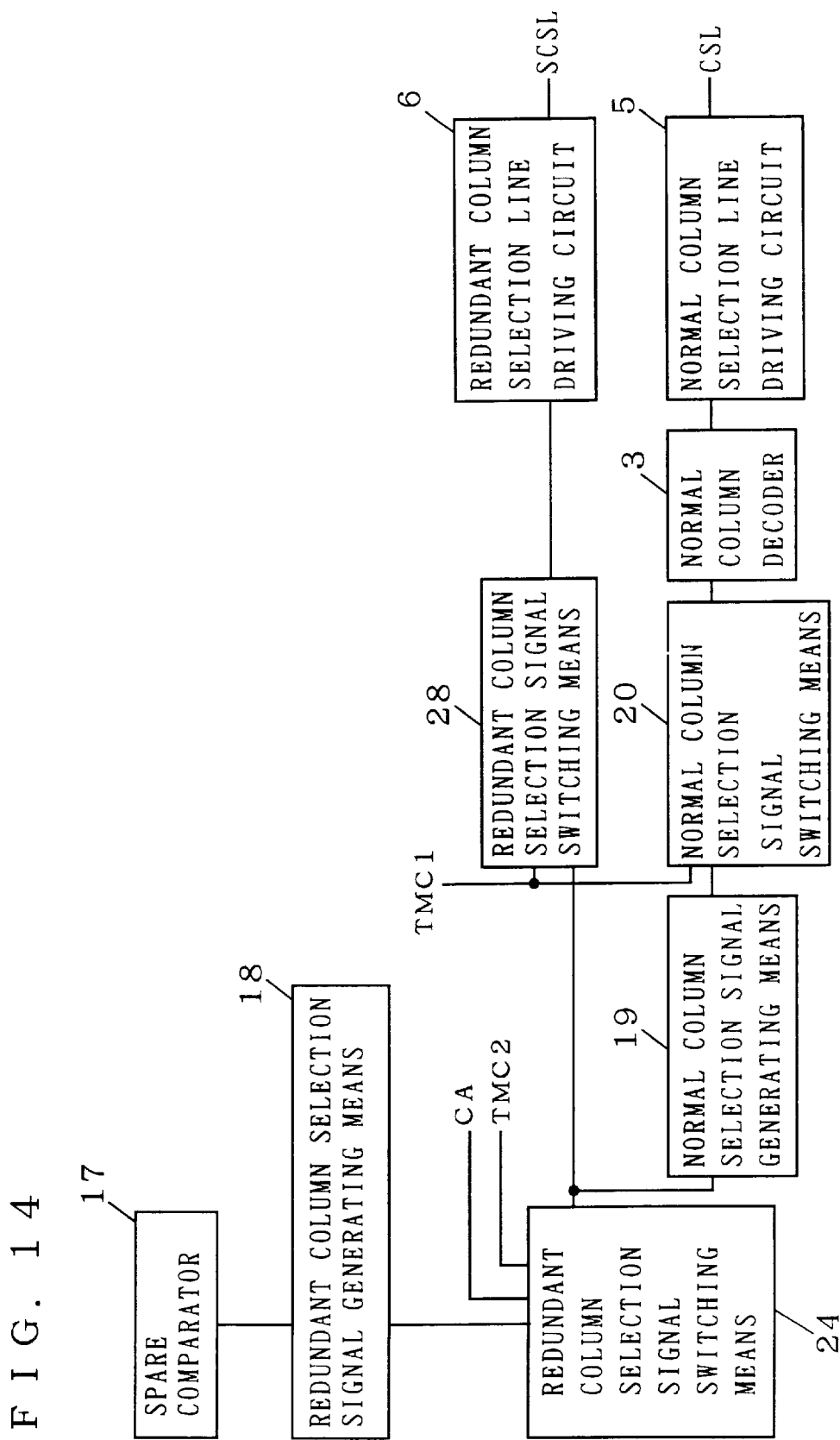
F I G. 14

6,002,621

1

SEMICONDUCTOR MEMORY DEVICE

This is a Continuation-In-Part of Ser. No. 08/852,643, now U.S. Pat. No. 5,781,484 filed May 7, 1997.

BACKGROUND OF THE INVENTION

1. Field of the Invention

The present invention relates to a semiconductor memory device including a spare memory array to compensate for a failure of a normal memory array.

2. Description of the Background Art

FIG. 21 is a conceptional diagram illustrating a background-art semiconductor memory device including a spare memory array. A memory array of FIG. 21 consists of a normal memory array 1 and a spare memory array 2 used to replace the normal memory array 1 if the normal memory array 1 has some defective memory cell. Any normal memory cell in the normal memory array 1 is selected by an address signal. The address signal includes a column address signal and a row address signal. The column address signal is decoded by a normal column decoder 3 and a decoded signal is transmitted to a normal column selection line driving circuit 5. The normal column selection line driving circuit 5 activates one of a plurality of normal column selection lines 11 on the basis of the signal from the normal column decoder 3.

On the other hand, the row address signal is decoded by a normal row decoder 7 and a decoded signal is transmitted to a normal word line driving circuit 9. The normal word line driving circuit 9 activates one of a plurality of normal word lines 12 on the basis of the signal from the normal row decoder 7. FIG. 22 shows one of the normal column selection lines 11 and one of the normal word lines 12 being active in a normal operation. In FIG. 22, signal lines represented by heavy solid lines are active. A specific group of normal memory cells in the normal memory array 1 is selected by the active normal column selection line 11 and the active normal word line 12. Since a plurality of pairs of bit lines are provided with respect to one normal column selection line 11, a plurality of normal memory cells connected to the pairs of bit lines are selected at the same time.

FIG. 26 is a block diagram showing a relation between a selection signal line and pairs of bit lines. In FIG. 26 shown are a column selection line or a spare column selection line 40, sense amplifiers 41a to 41d to be enabled to operate by the column selection line 40, memory cells 42 to 44 which are arranged on separate columns and from which data are read out through one sense amplifier 41a, a pair of bit lines 45 connected to the sense amplifier 41a for reading and writing data from and into the memory cells 42 to 44 and the like, pairs of bit lines 46 to 48 connected to the sense amplifier 41b to 41d respectively, a normal word line 49 connected to the memory cell 42 and the like to select memory cells and spare word lines 50 and 51 connected to the spare memory cells 43 and 44 and the like respectively. When the column selection line 40 is activated, four pairs of bit lines are selected and eventually memory cells associated with an input address are selected.

If some normal memory cell is defective in the normal memory array 1, a normal word line or normal column selection line selecting the defective memory cell is replaced by a spare word line or spare column selection line in order to replace the normal memory cells in the normal memory array 1 by the spare memory cells in the spare memory array 2. For example, if some memory cell which is selected by a column selection line is defective, the column selection line

2 is not activated thus not selecting the normal memory cells and instead a spare column selection line is activated to select the spare memory cells in the spare memory array 2 when the address associated with the defective memory cell is inputted.

For example, when a spare column selection line 13 is used to replace one of the normal column selection lines 11 including some defective memory cell, the normal row decoder 7 and the normal word line driving circuit 9 perform the same operation as in a case of no failure in response to a row address signal specifying a row having no defective memory cell. In this case, given a column address signal specifying one of the normal column selection lines 11 having the defective memory cell, a defective column address detecting circuit 4 detects the column address signal and disable the normal column decoder 3, and a spare column selection line driving circuit 6a outputs a signal to drive the spare column selection line 13. FIG. 23 shows the spare column selection line 13 and one of the normal word lines 12 being active. In FIG. 23, signal lines represented by heavy solid lines are active.

If required, another one of the normal column selection lines 11 is further replacement by, for example, a spare column selection line 14. Receiving a signal from the defective column address detecting circuit 4, a spare column selection line driving circuit 6b drives the spare column selection line 14.

Furthermore, there is a case where one of the normal word lines 12 having some defective memory cell should be replaced by a spare word line 15 or a spare word line 16. In this case, a defective row address detecting circuit 8 detects a row address signal specifying the defective normal memory cell. Detecting this row address signal, the defective row address detecting circuit 8 outputs a spare row selection signal to a spare word line driving circuit 10a or 10b to drive a spare word line 15 or 16 respectively and further outputs a normal row selection signal to disable the normal row decoder 7.

Referring next to FIG. 24, configuration and operation of the defective column address detecting circuit 4 will be discussed. FIG. 24 is a block diagram illustrating a configuration of column selection means. The column selection means refers to the defective column address detecting circuit 4, the normal column selection line driving circuit 5 and the spare column selection line driving circuits 6a and 6b in FIG. 21. A spare comparator 17 stores information regarding a defective column address and compares a column address signal CA with the stored information to detect whether or not the column address signal CA specifies the defective column address. Spare column selection signal generating means 18 generates a spare column selection signal to make a spare column selection line non-active if the spare comparator 17 judges that the defective column address is not specified. Receiving the spare column selection signal, the spare column selection line driving circuit 6 operates to make the spare column selection line non-active. Receiving the spare column selection signal from the spare column selection signal generating means 18, normal column selection signal generating means 19 generates a normal column selection signal to make normal column selection lines active. In response to the normal column selection signal, the normal column decoder 3 and the normal column selection line driving circuit 5 operate to activate only the column selection line associated with this address.

In contrast, the spare column selection signal generating means 18 generates a spare column selection signal to make the spare column selection line active if the spare comparator 17 judges that the defective column address is specified. Receiving the spare column selection signal, the spare column selection line driving circuit 6 operates to make the spare column selection line active. Receiving the spare column selection signal from the spare column selection signal generating means 18, the normal column selection signal generating means 19 generates the normal column selection signal to make the normal column selection lines non-active. In response to the normal column selection signal, the normal column decoder 3 and the normal column selection line driving circuit 5 makes the normal column selection line non-active.

FIG. 25 illustrates a circuit configuration of the normal column selection signal generating means 19 in the semiconductor memory device including a plurality of spare comparators 17 and two spare column selection lines. The normal column selection signal generating means 19 consists of a NAND gate 21 for outputting a negative AND (logical product) of spare column selection signals ZSCS1 and ZSCS2 outputted form spare column selection signal generating means 18a and 18b and an inverter 23c for inverting an output of the NAND gate 21.

The normal column decoder 3 includes a plurality of NAND gates 3a, 3b and the like. For example, each of the NAND gates 3a and 3b receives the address signal CA through a plurality of signal lines. Each of the NAND gates 3a, 3b and the like is enabled to output a signal of "L" when the address signal CA takes a value associated with the corresponding gate. FIG. 25 shows the NAND gates 3a and 3b each having a single input end for receiving the address signal CA, for simple illustration. If a normal column selection signal NCE is "H", one of the NAND gates 3a, 3b and the like which is enabled by the address signal CA outputs the signal of "L". If the normal column selection signal NCE is "L", none of the NAND gates 3a, 3b and the like constituting the normal column decoder 3 outputs the signal of "L".

If no replacement by the spare memory cells is made, the spare column selection signal generating means 18a and 18b generate the spare column selection signals ZSCS1 of "H" and ZSCS2 of "H", respectively. Receiving the spare column selection signals ZSCS1 and ZSCS2, the spare column selection line driving circuits 6a and 6b output signals SCSL1 and SCSL2 being non-active to make the spare column selection lines 13 and 14 non-active, respectively. Receiving the signals ZSCS1 and ZSCS2, the normal column selection signal generating means 19 outputs the normal column selection signal NCE of "H" for controlling the normal column decoder 3 to activate one of signals CSL1 to CSLn to be given the normal column selection lines 11.

Next, a replacement of a defective normal memory cell selected by one of the normal column selection lines 11 by a spare memory cell selected by the spare column selection line 13 will be discussed. When a column address associated with the defective normal memory cell is inputted, the spare column selection signal generating means 18a generates the spare column selection signal ZSCS1 of "L" on the basis of the judgment made by a spare comparator 17a. In response to the signal ZSCS1, the spare column selection line driving circuit 6a outputs the signal SCSL1 which is active to keep the spare column selection line 13 active in association with this address. Furthermore, the spare column selection signal ZSCS2 remains "H" for the spare column selection line 14 which is not used. Then, in response to the spare column selection signal ZSCS1 of "L", the normal column selection signal NCE comes into "L" and the normal column selection lines 11 become non-active in association with this address. Therefore, no memory cell in the memory cell array 1 having some defective memory cell is selected.

In the background-art semiconductor memory device having the above configuration, the normal column selection line or the normal word line which has been once replaced is never selected. Accordingly, a requirement of writing data into the replaced normal column or normal row to observe the effect of interference between memory cells in evaluation of the semiconductor memory device or failure analysis can not be satisfied.

SUMMARY OF THE INVENTION

The present invention is directed to a semiconductor memory device. According to a first aspect of the present invention, the semiconductor memory device comprises: a plurality of first signal lines used to select normal memory cells; a decoder for selecting one of the plurality of first signal lines to be active in response to an address signal; a plurality of second signal lines each capable of being used to replace one of the plurality of first signal lines which is connected to a defective normal memory cell to select a spare memory cell for replacement of the defective normal memory cell; a plurality of spare comparators provided correspondingly to the plurality of second signal lines, each capable of being used to detect an address signal associated with the replaced one of the plurality of first signal lines; a plurality of spare selection signal generating means each capable of being used to generate a spare selection signal, for enabling activation of one of the plurality of second signal lines related to the address signal associated with the replaced one of the plurality of first signal lines when the one of the plurality of spare comparators detects the address signal; normal selection signal generating means for generating a normal selection signal to disable the decoder so that the plurality of first signal lines may not become active when the one of the plurality of spare comparators detects the address signal associated with the replaced one of the plurality of first signal lines; and selection signal switching means for inverting the normal selection signal in response to a test-mode signal. In the semiconductor memory device of the first aspect, the replaced one of first signal lines is enabled to be active in response to the test-mode signal at least in a writing operation while the one of the plurality of second signal lines corresponding to the replaced one of the plurality of first signal lines is enabled to be active by the one of the plurality of spare selection signal generating means in a test operation.

According to a second aspect of the present invention, in the semiconductor memory device of the first aspect, the replaced one of the plurality of first signal lines becomes active in response to the test-mode signal only in the writing operation.

According to a third aspect of the present invention, in the semiconductor memory device of the first aspect, the replaced one of the plurality of first signal lines becomes active in response to the test-mode signal only while a sensing operation is not performed.

According to a fourth aspect of the present invention, in the semiconductor memory device of the third aspect, the test-mode signal becomes active when a burn-in test is performed.

According to a fifth aspect of the present invention, in the semiconductor memory device of the first aspect, the normal selection signal generating means is a first NAND gate for outputting a negative AND of the spare selection signals outputted from all the plurality of spare selection signal generating means, and the selection signal switching means is a second NAND gate for outputting a negative AND of an output signal of the first NAND gate and the test-mode signal.

According to a sixth aspect of the present invention, the semiconductor memory device comprises: a plurality of first signal lines being selectively made active in response to an address signal to select normal memory cells in a normal operation; a plurality of second signal lines each capable of being used to replace one of the plurality of first signal lines which is connected to a defective normal memory cell to select a spare memory cell for replacement of the defective normal memory cell in the normal operation; second signal line selecting means enabling the plurality of second signal lines to selectively become active in response to the address signal and a first test-mode signal in a test operation; a decoder for selecting one of the plurality of first signal lines to be active in response to the address signal; a plurality of spare comparators provided correspondingly to the plurality of second signal lines, each capable of being used to detect an address signal associated with the replaced one of the plurality of first signal lines; a plurality of spare selection signal generating means each capable of being used to generate a spare selection signal, for enabling activation of one of the plurality of second signal lines related to the address signal associated with the replaced one of the plurality of first signal lines when the one of the plurality of spare comparators detects the address signal; normal selection signal generating means for generating a normal selection signal to disable the decoder so that the plurality of first signal lines may not become active when the one of the plurality of spare comparators detects the address signal associated with the replaced one of the plurality of first signal lines; and normal selection signal switching means for inverting the normal selection signal in response to a second test-mode signal. In the semiconductor memory device of third aspect, the normal selection signal generating means generates the normal selection signal also when the second signal line selecting means enables the one of the plurality of second signal lines to be active.

According to a seventh aspect of the present invention, the semiconductor memory device comprises: a plurality of first signal lines used to select normal memory cells; a decoder for selecting one of the plurality of first signal lines to be active in response to an address signal; a plurality of second signal lines each capable of being used to replace one of the plurality of first signal lines which is connected to a defective normal memory cell to select a spare memory cell for replacement of the defective normal memory cell; a plurality of spare comparators provided correspondingly to the plurality of second signal lines, each capable of being used to detect an address signal associated with the replaced one of the plurality of first signal lines; a plurality of spare selection signal generating means each capable of being used to generate a spare selection signal, for enabling activation of one of the plurality of second signal lines related to the address signal associated with the replaced one of the plurality of first signal lines when the one of the plurality of spare comparators detects the address signal; normal selection signal generating means for generating a normal selection signal to disable the decoder so that the plurality of first signal lines may not become active when the one of the plurality of spare comparators detects the address signal associated with the replaced one of the plurality of first signal lines; and selection signal switching means for inverting the normal selection signal and the plurality of spare selection signals in response to a first test-mode signal. In the semiconductor memory device of the fourth aspect, the replaced one of first signal lines is enabled to be active in response to the first test-mode signal while one of the plurality of second signal lines corresponding to the replaced one of the plurality of first signal lines is enabled to be non-active in a test operation.

In the semiconductor memory device of the first aspect, while no spare selection signal is inverted, the first signal line to select the replaced normal memory cells in the test operation also becomes active to write data therein.

In the semiconductor memory device of the second aspect, even if data are written into both the replaced first signal line and the corresponding second signal line used for replacing at the same time in the test mode, the data are not read therefrom at the same time. It is possible to read data from the replaced first signal line without returning from the test mode.

In the semiconductor memory device of the third aspect, it is possible to refresh the replaced first signal line with the data which has been determined upon completing the sensing operation of the corresponding second signal line used for replacing.

In the semiconductor memory device of the fourth aspect, even if the replacement is performed by the second signal line, it is possible to perform the burn-in that applies a stress to the memory by increasing the power supply voltage as compared with the normal operation on the first signal line which is judged as defective.

In the semiconductor memory device of the fifth aspect, the selection signal switching means is achieved with a slight change in circuit configuration, for example, addition of two transistors by providing the first and second NAND gates.

In the semiconductor memory device of the sixth aspect, data can be written into all the normal memory cells and the spare memory cells in the test operation.

In the semiconductor memory device of the seventh aspect, with a slight addition of the selection signal switching means for inverting the normal selection signal and the spare selection signal, it is possible to select the once-replaced first signal line to write data therein while avoiding selection of the second signal lines.

An object of the present invention is to provide a semiconductor memory device which enables a test mode where a replaced normal column selection line or normal word line may be also selected.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a block diagram illustrating a configuration of column selection means in accordance with a second preferred embodiment of the present invention;

FIG. 14 is a block diagram illustrating a configuration of column selection means in accordance with a fifth preferred embodiment of the present invention;

DESCRIPTION OF THE PREFERRED EMBODIMENTS

The First Preferred Embodiment

Figure 1:
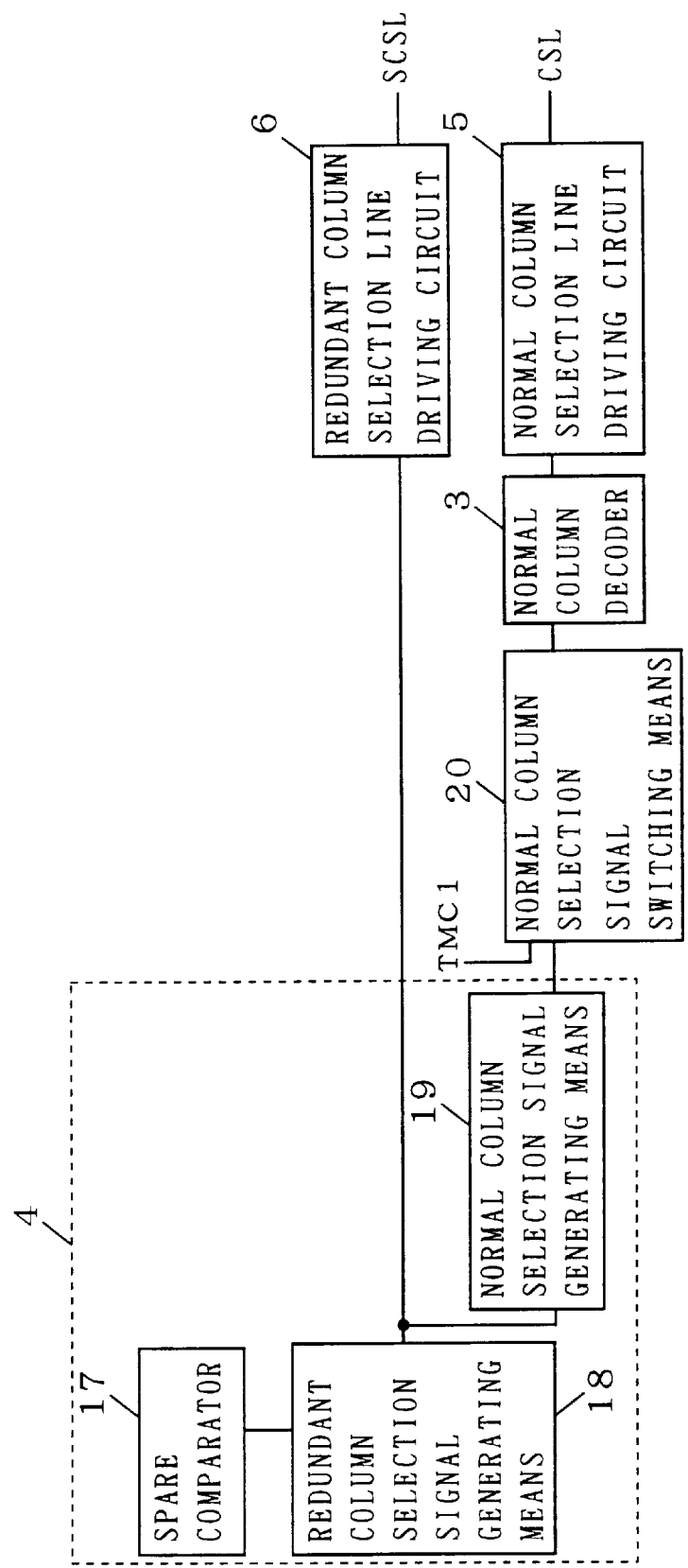
FIG. 1 is a block diagram illustrating a configuration of column selection means in accordance with a first preferred embodiment of the present invention.
Figure 21:
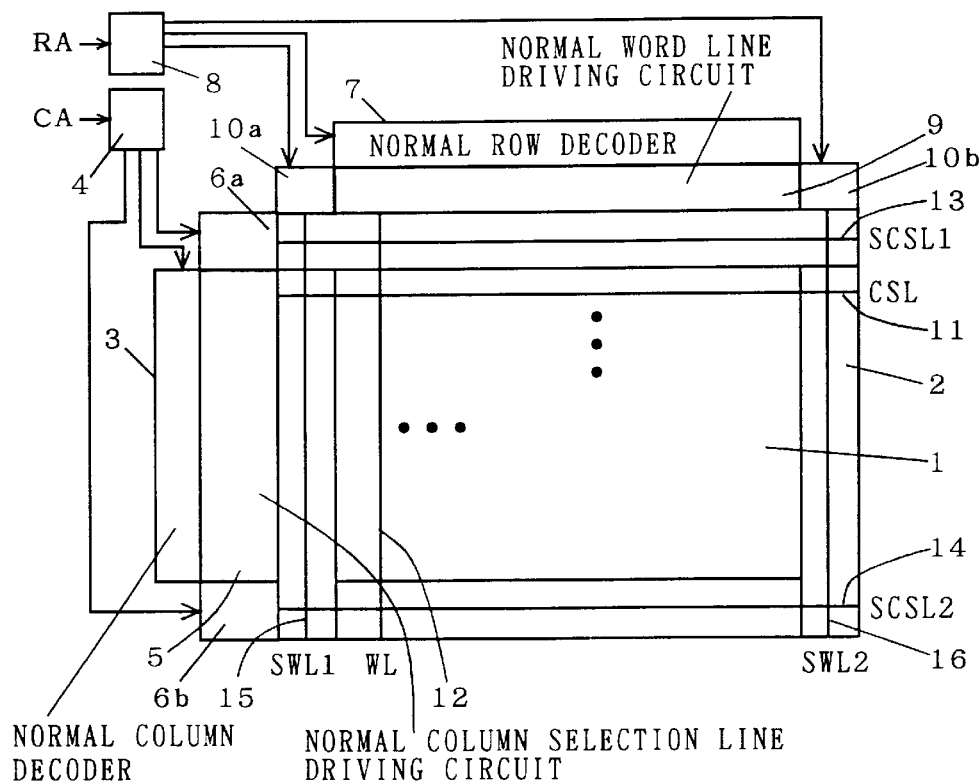
FIG. 21 is a conceptional diagram illustrating a background-art memory array configuration.
Figure 22:
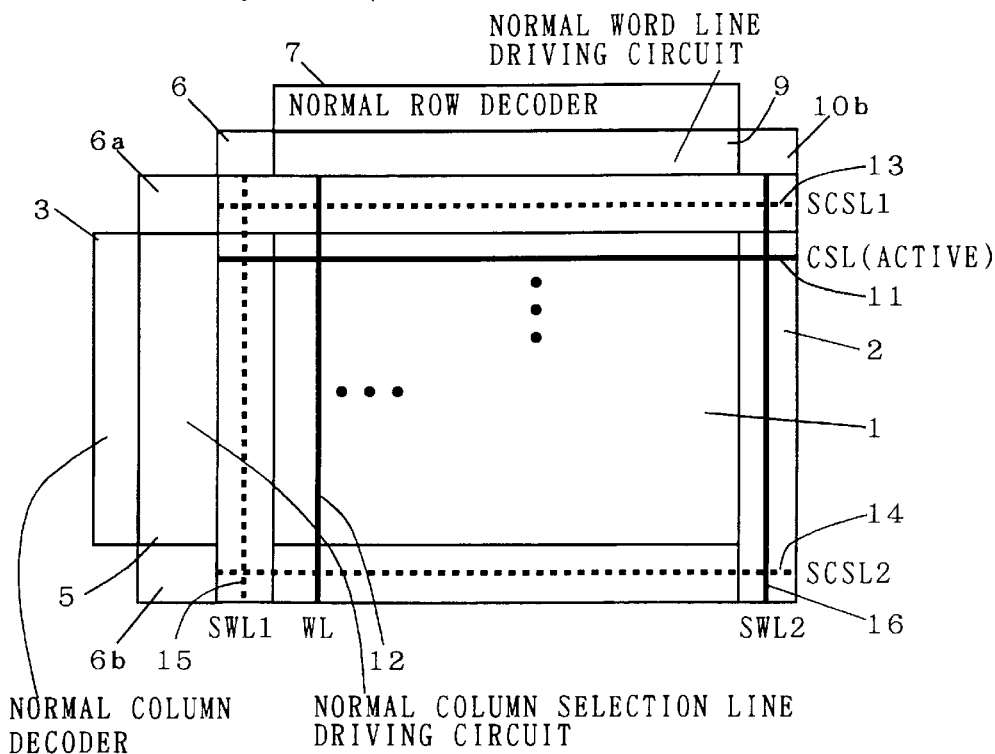
FIGS. 22 and 23 are conceptional diagrams illustrating how to select memory cells in the background art.
Figure 23:
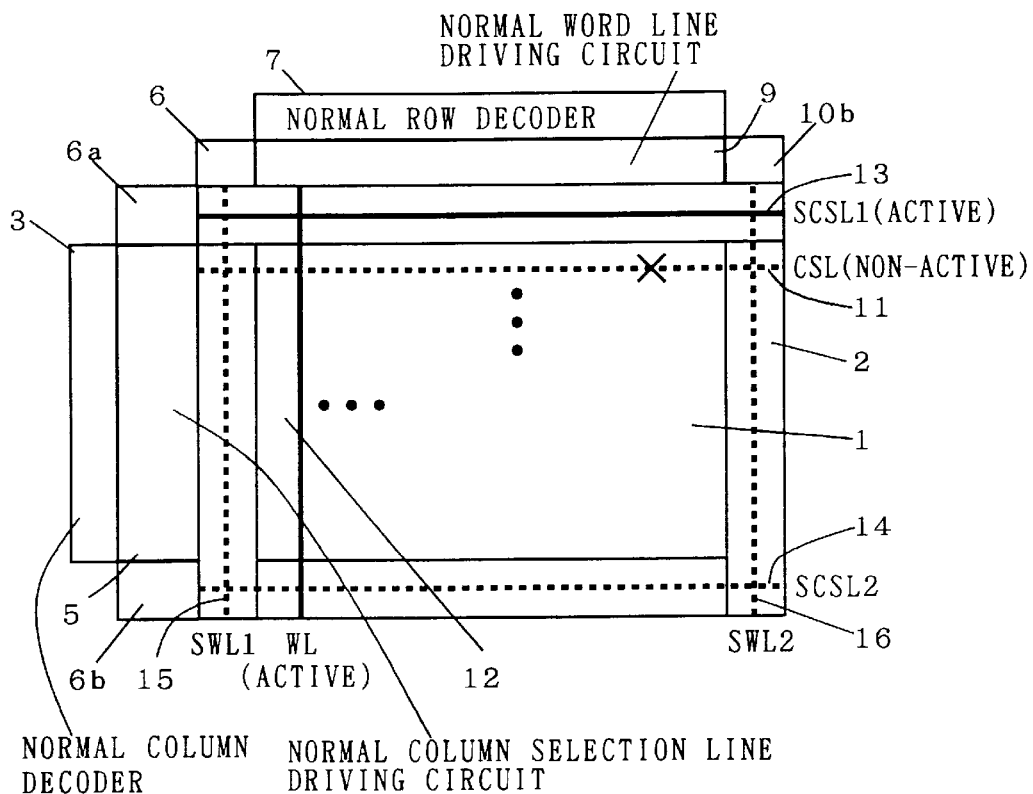
Figure 24:
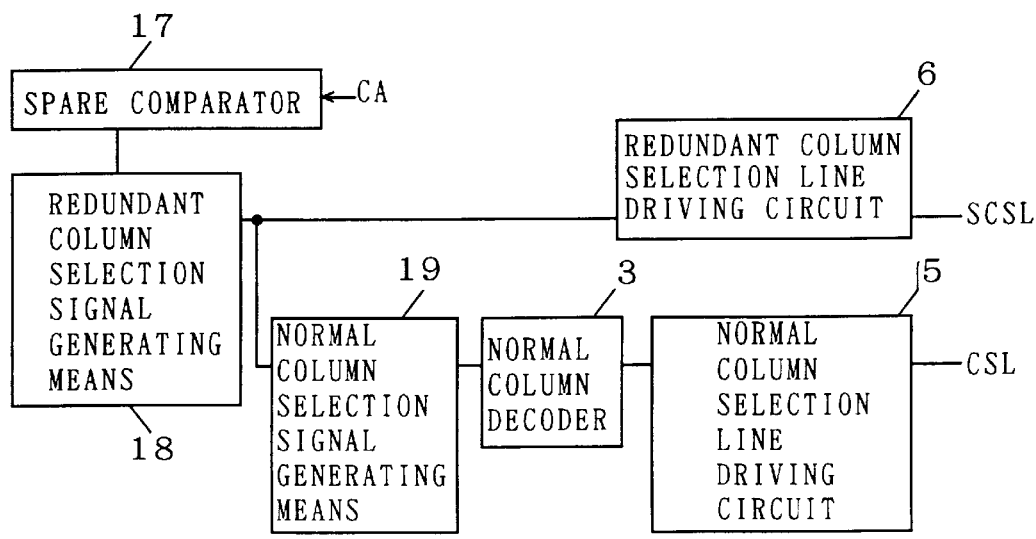
FIG. 24 is a block diagram illustrating a configuration of column selection means in the background art.

FIG. 1 is a block diagram illustrating a configuration of column selection means in a semiconductor memory device in accordance with the first preferred embodiment of the present invention. The semiconductor memory device of the first preferred embodiment includes the normal column decoder 3, the defective column address detecting circuit 4 to control the normal column selection line driving circuit 5 for driving the column selection lines and the spare column selection line driving circuits 6a and 6b for driving the spare column selection lines, the normal row decoder 7 and the defective row address detecting circuit 8 to control the normal word line driving circuit 9 and the spare word line driving circuits 10a and 10b, like that of the background art as shown in FIG. 21 but not shown in FIG. 1.

The defective column address detecting circuit 4 consists of the spare comparator 17, the spare column selection signal generating means 18 and the normal column selection signal generating means 19. The spare comparator 17 determines whether or not the inputted address signal CA indicates an address of memory cells replaced by the spare memory cells. The spare column selection signal generating means 18 generates the spare column selection signal to make the spare column selection line active or non-active on the basis of a detection result made by the spare comparator 17. The normal column selection signal generating means 19 generates the normal column selection signal to make the normal column selection line active or non-active.

The semiconductor memory device of the first preferred embodiment further includes normal column selection signal switching means 20 for forcefully setting the normal column selection signal to bring the normal column selection line into an active state on the basis of a test-mode signal.

Now a normal operation after replacement of memory cells selected by a normal column selection line specified by a column address by the spare memory cells selected by a spare column selection line will be discussed.

In the normal operation, a test-mode signal TMC1 is non-active. The spare column selection signal generating means 18 generates the spare column selection signal to activate the spare column selection line in association with the address for that replacement by the spare memory cells on the basis of the judgment of the spare comparator 17.

At the address for that replacement, the spare column selection signal is inputted to the spare column selection line driving circuit 6 and then the spare column selection line driving circuit 6 activates the spare column selection line. At the same time, the normal column selection signal generating means 19 receives the spare column selection signal from the spare column selection signal generating means 18 and generates the normal column selection signal to make the normal column selection line non-active.

On the other hand, at addresses other than the column address for that replacement, the spare column selection signal generating means 18 generates the spare column selection signal to make the spare column selection line non-active. Receiving the spare column selection signal, the normal column selection signal generating means 19 generates the normal column selection signal to make the normal column selection line active.

Next, a mode in which a test is performed when the normal memory cells in the normal column are replaced by the spare memory cells in the spare column ("test mode A" hereinafter) will be discussed.

With the test-mode signal TMC1 activated, the semiconductor memory device comes into the test mode A. When the address for that replacement of the normal memory cells in the normal column by the spare memory cells in the spare column is inputted, the spare column selection signal generating means 18 generates the spare column selection signal to activate the spare column selection line, and the normal column selection signal generating means 19 generates the normal column selection signal to make the normal column selection line non-active, like in the normal operation.

Then, receiving the test-mode signal, the normal column selection signal switching means 20 sets the normal column selection signal to activate the normal column selection line, regardless of the value of the normal column selection signal generated by the normal column selection signal generating means 19. In the test mode A, the switching operation made by the normal column selection signal switching means 20 allows simultaneous activation of the spare column selection line and the replaced normal column selection line.

Figure 2:
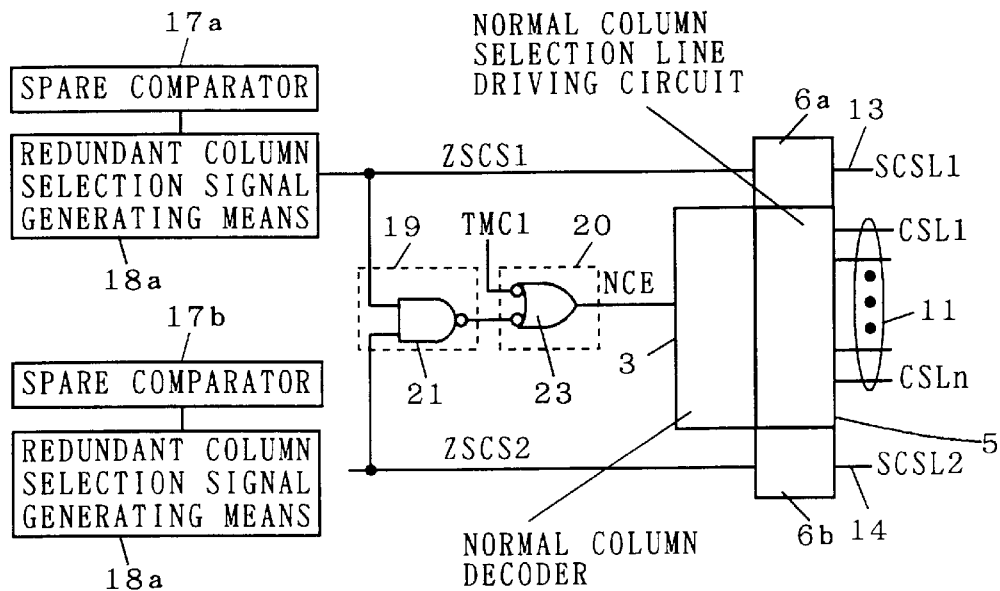
FIG. 2 illustrates an example of circuit configuration of normal column selection signal switching means of FIG. 1.

FIG. 2 illustrates a circuit configuration of the normal column selection signal generating means 19 in the semiconductor memory device including a plurality of spare comparators and two spare column selection lines. For simplicity, discussion will be made herein on two spare column selection lines, but three or more spare column selection lines may be used and that also applies to the following preferred embodiments.

The spare comparators 17a and 17b store different addresses specifying replaced memory cells. The spare column selection signal generating means 18a and 18b generate the spare column selection signals ZSCS1 and ZSCS2 in accordance with the detection results of the spare comparators 17a and 17b, respectively. The normal column selection signal generating means 19 includes the NAND gate 21 for outputting a negative AND of the spare column selection signals ZSCS1 and ZSCS2.

The normal column selection signal switching means 20 includes a NAND gate 23 for outputting a negative AND of the test-mode signal TMC1 and an output signal of the NAND gate 21. An output signal of the NAND gate 23 serves as the normal column selection signal NCE.

The normal column selection signal generating means 19 includes only the NAND gate 21 and no inverter 23c since the NAND gate 23 also serves as an inverter.

In general, the NAND gate 23 consists of four transistors and works also as an inverter. That reduces the number of transistors in the normal column selection signal generating means 19 by one. In total, the number of transistors increases by two. Thus, such a simple configuration allows the switching of the normal column selection signal NCE.

Figure 3:
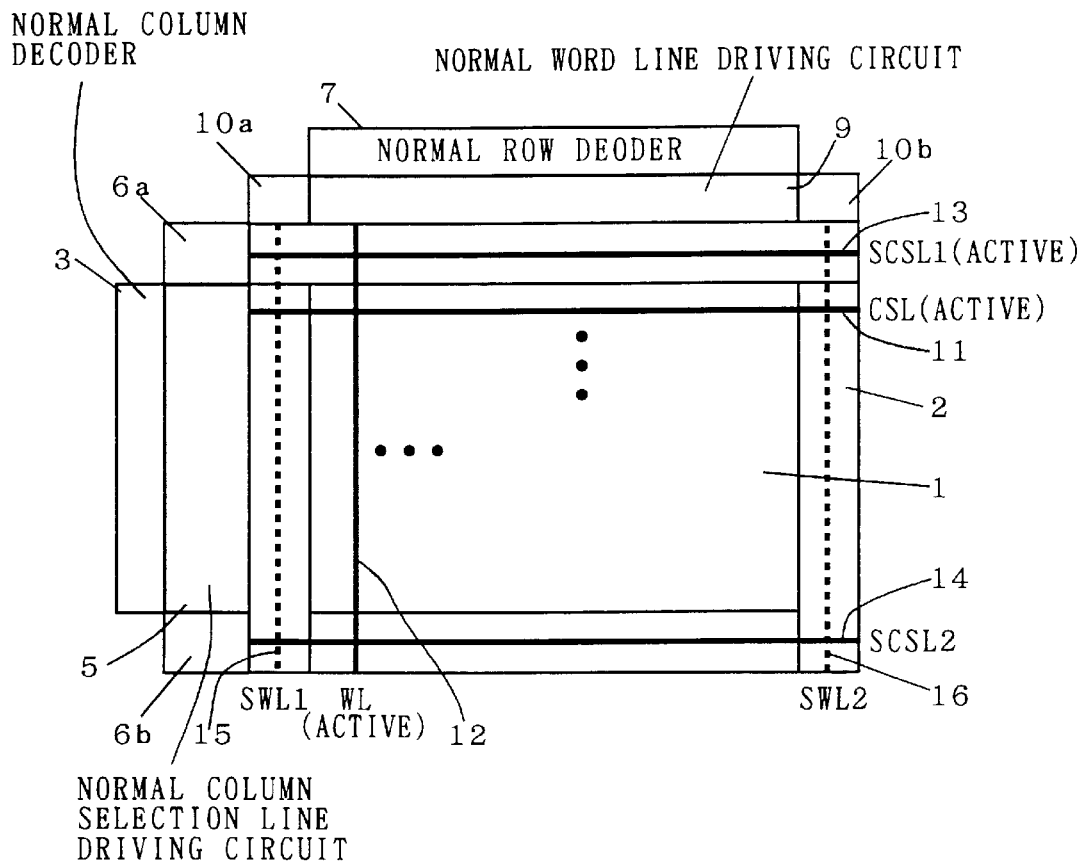
FIG. 3 is a conceptional diagram illustrating an operation of a semiconductor memory device in accordance with the first preferred embodiment of the present invention.

Referring next to FIG. 3, an operation of the semiconductor memory device including the column selection means of FIG. 2 will be discussed. FIG. 3 is a conceptional diagram illustrating a memory-array configuration and an operation of the semiconductor memory device of FIG. 2.

The memory array in the semiconductor memory device of the first preferred embodiment includes the normal memory array 1 and the spare memory array 2 used to replace the normal memory array 1 if the normal memory array 1 has some defective memory cell, like that of the semiconductor memory device in the background art. Further, the semiconductor memory device of the first preferred embodiment includes the normal column decoder 3, the normal column selection line driving circuit 5 for driving the normal column selection lines and the spare column selection line driving circuit 6 for driving the spare column selection lines, like that in the background art. Furthermore, the semiconductor memory device of the first preferred embodiment includes the normal row decoder 7, the normal word line driving circuit 9 for driving the normal word lines, the spare word line driving circuit 10 for driving the spare word lines, like that in the background art.

If a normal memory cell selected by a normal column selection line is defective, the normal column selection line is replaced by a spare column selection line in order to replace the normal memory cell by a spare memory cell, like in the background art.

Figure 25:
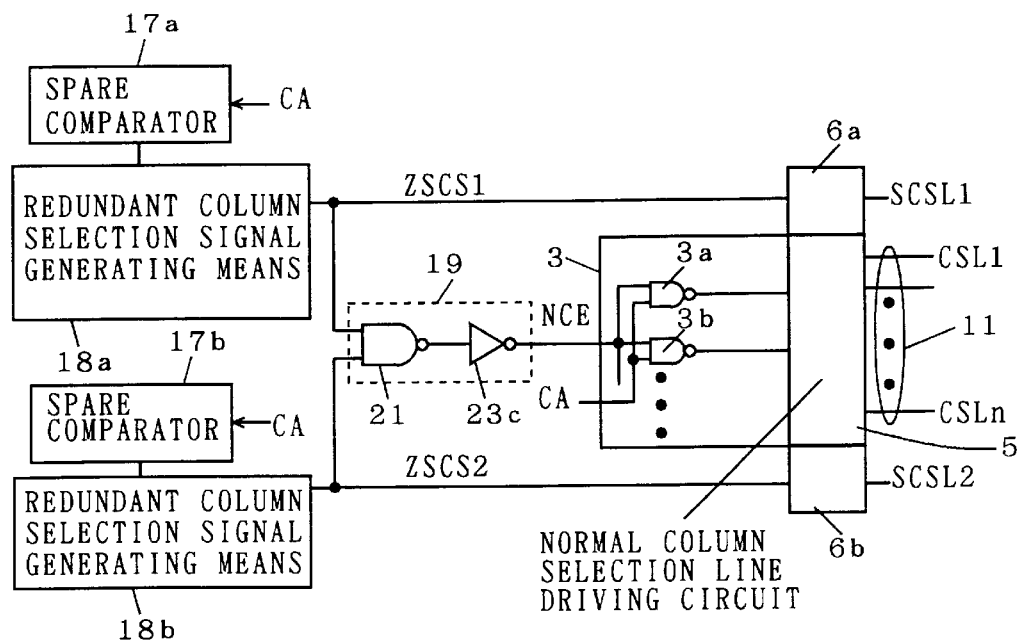
FIG. 25 illustrates an example of circuit configuration of normal column selection signal generating means and a normal column decoder.
Figure 26:
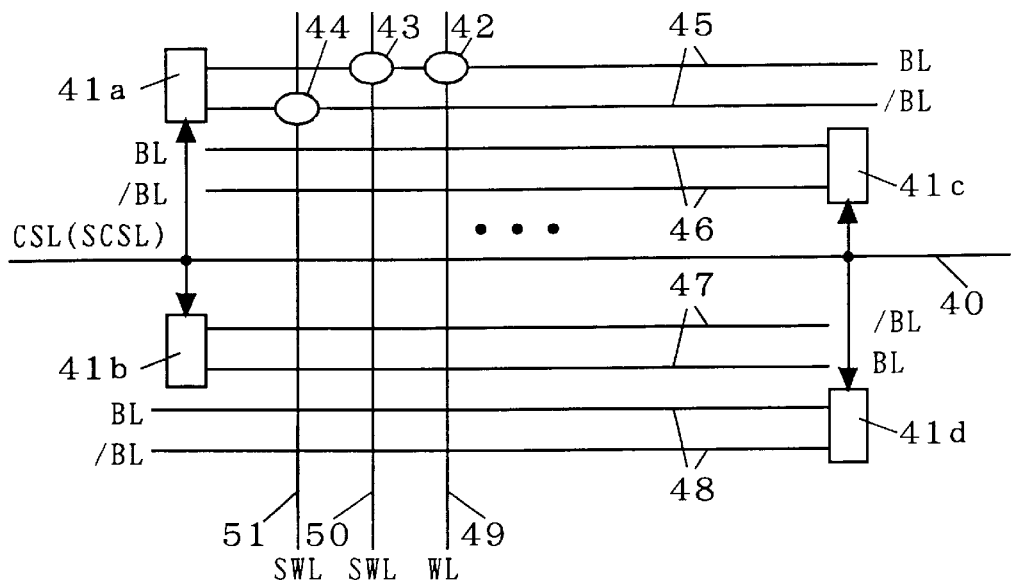
FIG. 26 is a block diagram illustrating a relation between a selection line and pairs of bit lines.

In the normal operation, the test-mode signal TMC1 is set to "H" and the NAND gate 23 works as an inverter for inverting the output signal of the NAND gate 21. Therefore, the combination of the normal column selection signal generating means 19 and the normal column selection signal switching means 20 of FIG. 2 is equivalent in circuit configuration to the normal column selection signal generating means 19 of FIG. 25, and performs the same operation as discussed referring to FIG. 25, so the normal operation will not be herein discussed.

If the semiconductor memory device is in the test mode A, the spare column selection line 13 or 14 becomes active to select the spare memory cells in the spare memory array 2 when the address for that replacement is inputted. At the same time, the replaced one of the column selection lines 11 is also activated to select the normal memory cells in the normal memory array 1.

In the test mode, the test-mode signal TMC1 is "L" (active). If the defective memory cell is replaced by the spare memory cell through the spare column selection line, the spare column selection line 13 or 14 is selected by the column address specifying the defective memory cell. At the same time, the NAND gate 23 outputs the normal column selection signal NCE of "H" since the test-mode signal TMC1 is "L" and accordingly the normal column selection lines 11 are activated, including the normal column selection line for selecting the defective memory cell.

Thus, the semiconductor memory device of the first preferred embodiment enables writing of data into the normal memory cells in the normal memory array 1, which is replaced by the spare memory cells. Writing data into the normal memory cells allows a test for checking the effect of interference between memory cells and the like.

As to row, it is also possible to achieve such a configuration as above discussed on column, which includes normal word lines and spare word lines instead of the normal column selection lines and the spare column selection lines respectively, to perform the same operation.

Figure 4:
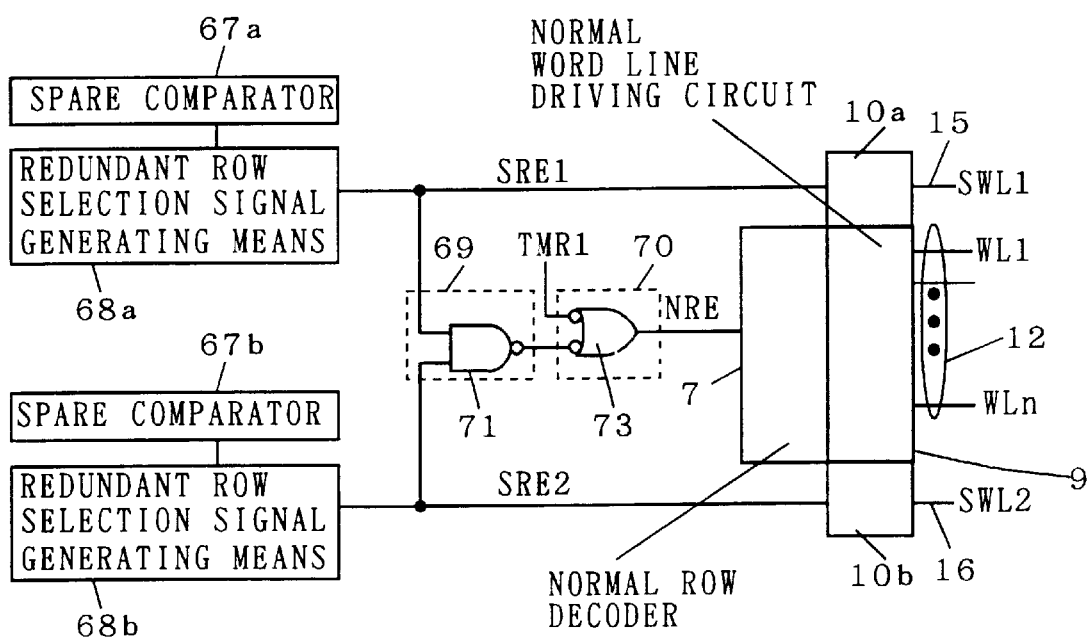
FIG. 4 is a block diagram illustrating a configuration of row selection means in accordance with another aspect of the first preferred embodiment of the present invention.

FIG. 4 illustrates a configuration of row selection means in accordance with another aspect of the first preferred embodiment. In FIG. 4 shown are spare comparators 67a and 67b corresponding to the spare comparators 17a and 17b, the spare row selection signal generating means 68a and 68b corresponding to the spare column selection signal generating means 18a and 18b, normal row selection signal generating means 69 corresponding to the normal column selection signal generating means 19, normal row selection signal switching means 70 corresponding to the normal column selection signal switching means 20, the spare word line driving circuits 10a and 10b corresponding to the spare column selection line driving circuits 6a and 6b, the normal row decoder 7 corresponding to the normal column decoder 3 and the normal word line driving circuit 9 corresponding to the normal column selection line driving circuit 5. The row selection means of FIG. 4 selects the normal word lines 12 or the spare word line 15 or 16, while the column selection means of FIG. 2 selects the normal column selection lines 11 or the spare column selection line 13 or 14. Further, the normal row selection signal generating means 69 includes a NAND gate 71 and the normal row selection signal switching means 70 includes a NAND gate 73, while the normal column selection signal generating means 19 includes the NAND gate 21 and the normal column selection signal switching means 20 includes the NAND gate 23.

The Second Preferred Embodiment

FIG. 5 is a block diagram illustrating a configuration of column selection means in a semiconductor memory device in accordance with the second preferred embodiment of the present invention. In addition to the configuration of the column selection means of the first preferred embodiment shown in FIG. 1, the column selection means of FIG. 5 further includes spare column selection signal switching means 24 for switching the spare column selection signal so that the spare column selection line may become active or non-active on the basis of a test-mode signal TMC2 and the column address CA.

If the spare column has some defective memory cell, the semiconductor memory device remains defective after a defective normal column is replaced by this spare column. In order to avoid the defective semiconductor memory device due to the above cause, it is necessary to check if the spare column has some effective memory cell. The spare column selection signal switching means 24 activates the spare column selection line in response to the column address signal before replacement to inspect the memory cells in the spare column as one of the test modes. In other words, the spare column selection signal switching means 24 works as the spare column selection line selecting means during the test operation.

Figure 6:
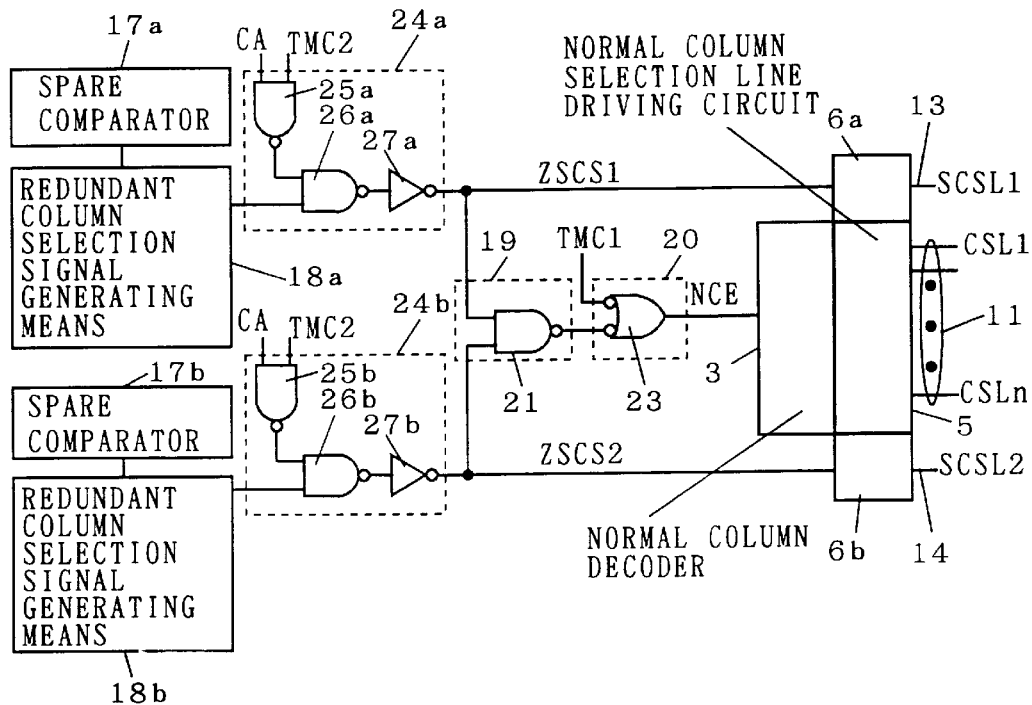
FIG. 6 is an example of circuit configuration of spare column selection signal switching means of FIG. 5.

FIG. 6 is an example of circuit configuration of spare column selection signal switching means 24 in the semiconductor memory device of the second preferred embodiment. In addition to the configuration of FIG. 2, spare column selection signal switching means 24a for activating the spare column selection line 13 is interposed between the spare column selection signal generating means 18a and the normal column selection signal generating means 19, and spare column selection signal switching means 24b for activating the spare column selection line 14 is interposed between the spare column selection signal generating means 18b and the normal column selection signal generating means 19. Other elements correspond to those given the same reference signs in FIG. 3.

First, a test mode before replacement ("test mode B" hereinafter) will be discussed. The spare column selection signal switching means 24a consists of a NAND gate 25a receiving the test-mode signal TMC2 and the column address signal CA, a NAND gate 26a receiving respective outputs from the NAND gate 25a and the spare column selection signal generating means 18a and an inverter 27a for inverting an output from the NAND gate 26a. Similarly, the spare column selection signal switching means 24b consists of NAND gates 25b and 26b and an inverter 27b corresponding to the NAND gates 25a and 26a and the inverter 27a, respectively. The spare column selection signal switching means 24a and 24b never perform switching operations in accordance with the column address signal CA until the test-mode signal TMC2 is brought into "H". When the test-mode signal TMC2 comes into "H", the NAND gates 25a and 25b bring the spare column selection signals ZSCS1 and ZSCS2 into "L" to activate the spare column selection lines 13 and 14, respectively. The NAND gates 25a and 25b output "L" in association with the test-mode signal TMC2 of "H" and the respective column address signals CA of different values. For example, if the NAND gate 25a outputs "L" when the test-mode signal TMC2 is "H" and an address Ad1 is inputted, the NAND gate 25b outputs "H", and if the NAND gate 25a outputs "H" when an address Ad2 is inputted, the NAND gate 25b outputs "L". For simple illustration, FIG. 6 shows the NAND gates 25a and 25b each having a single input end for receiving the column address signal CA.

Thus, when the test-mode signal TMC2 is "H", changing the test-mode signal TMC1 into "H" disables the normal column selection line. In the test mode B, the spare column selection lines sequentially become active to select all of the spare memory cells in the spare memory array.

In the normal operation, since the outputs of the spare column selection signal generating means 18a and 18b go through the spare column selection signal an switching means 24a and 24b without being changed, the column selection means of the second preferred embodiment performs the same operation as that of the semiconductor memory device of the first preferred embodiment as discussed referring to FIG. 2. Specifically, when the test-mode signal TMC2 is "L", the NAND gate 25a always outputs "H" regardless of the column address signal CA and accordingly the combination of the NAND gate 26a and the inverter 27a simply works as a buffer to transmit the signals outputted from the spare column selection signal generating means 18a and 18b without changing as the spare column selection signals ZSCS1 and ZSCS2. At that time, since the test-mode signal TMC1 is "H", the normal column selection signal switching means 20 works as an inverter.

Next, the test mode A will be discussed. In order to enter the test mode A, it is necessary to input the test-mode signal TMC1 of "L" (active) and the test-mode signal TMC2 of "L" (non-active). Since the spare column selection signal generating means 18a outputs "L" to supply the spare column selection signal ZSCS1 of "L" and the test-mode signal TMC1 of "L" is inputted to supply the normal column selection signal NCE of "H" when the (column) address for replacement by the spare circuit is inputted, like the operation of the first preferred embodiment as shown in FIG. 2, the spare column selection line and the normal column selection line are simultaneously activated and data are simultaneously written into the memory cells selected by these selection lines.

Furthermore, it is also possible to sequentially activate only the spare column selection lines after the replacement.

As to row, it is also possible to achieve such a configuration as above discussed on column, which includes normal word lines and spare word lines instead of the normal column selection lines and the spare column selection lines respectively, to perform the same operation.

Figure 7:
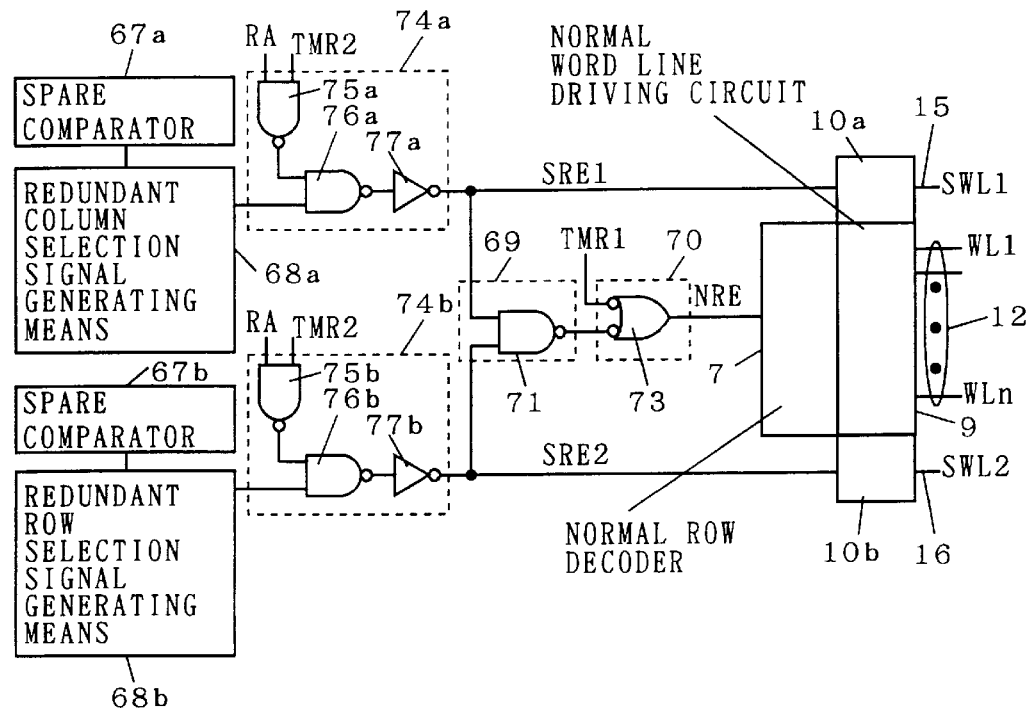
FIG. 7 is a block diagram illustrating a configuration of row selection means in accordance with another aspect of the second preferred embodiment of the present invention.

Specifically, in addition to the circuit configuration of the row selection means of FIG. 4, the row selection means of FIG. 7 further includes the spare row selection signal switching means 74a and 74b.

The spare row selection signal switching means 74a and 74b includes NAND gates 75a and 75b, NAND gates 76a and 76b and inverters 77a and 77b, respectively, while the spare column selection signal switching means 24a and 24b of FIG. 6 include the NAND gates 25a and 25b, the NAND gates 26a and 26b and the inverters 27a and 27b, respectively.

The Third Preferred Embodiment

Figure 8:
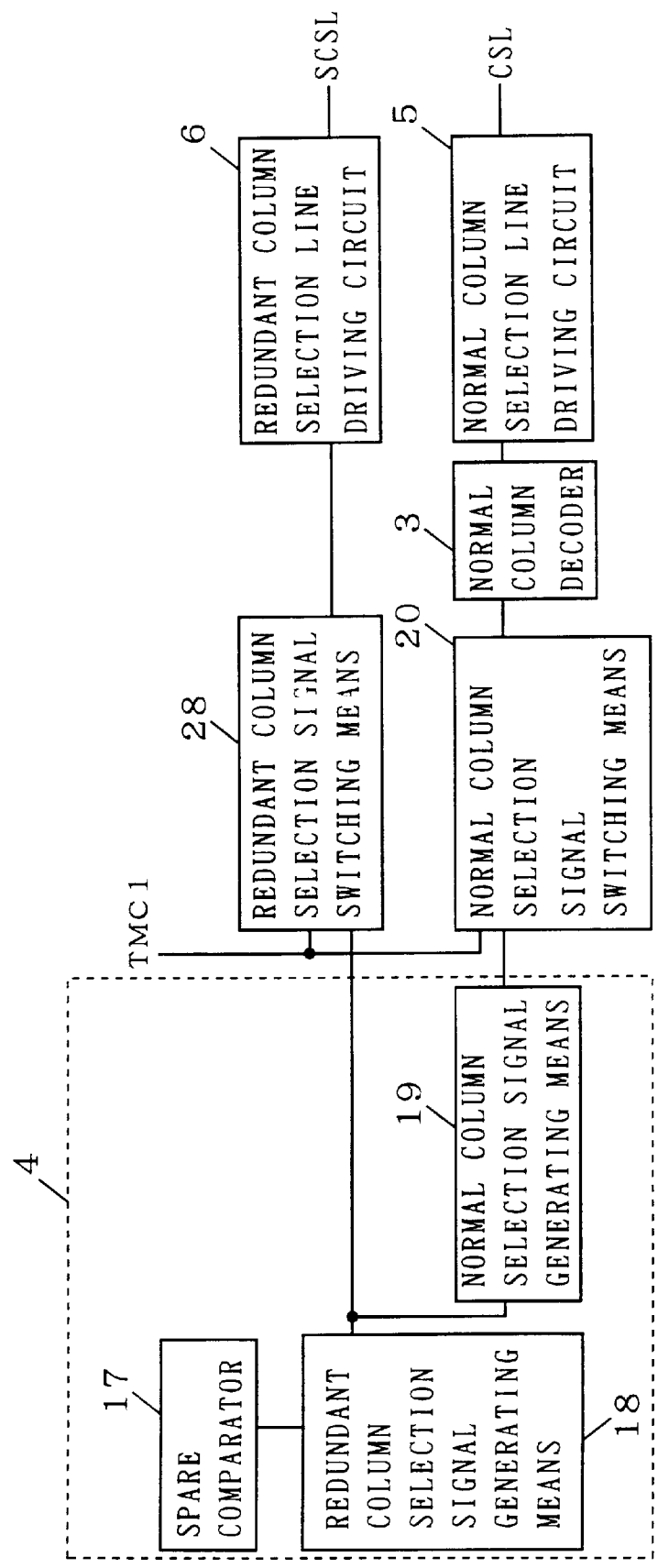
FIG. 8 is a block diagram illustrating a configuration of column selection means in accordance with a third preferred embodiment of the present invention.

FIG. 8 is a block diagram illustrating a configuration of column selection means in a semiconductor memory device in accordance with the third preferred embodiment of the present invention. In addition to the configuration of the column selection means shown in FIG. 1, the column selection means of FIG. 8 further includes spare column selection signal switching means 28 between the spare column selection signal driving circuit 6 and the spare column selection signal generating means 18. Other elements correspond to those given the same reference signs in FIG. 1. The spare column selection signal switching means 28 switches the spare column selection signal so that the spare column selection line used for replacement may be kept non-active during the test operation.

In the normal operation, since the test-mode signal TMC1 is non-active and neither the normal column selection signal switching means 20 nor the spare column selection signal switching means 28 performs any switching operation, the column selection means of FIG. 8 selects the spare column selection line and the normal column selection line, like that of FIG. 1.

In the test mode A, the test-mode signal TMC1 becomes active. The normal column selection signal switching means 20 switches the normal column selection signal outputted from the normal column selection signal generating means 19 to permit the normal column selection line to become active. At the same time, the spare column selection signal switching means 28 switches the spare column selection signal outputted from the spare column selection signal generating means 18 so that the spare column selection signal may be kept non-active during the test operation.

Figure 9:
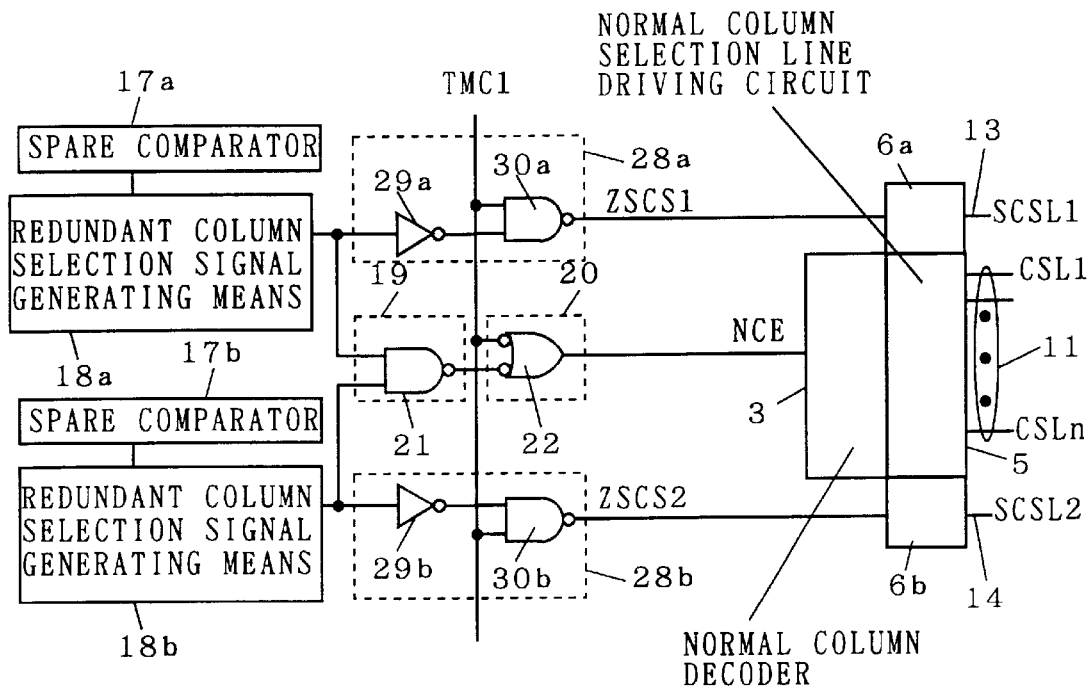
FIG. 9 an example of circuit configuration of spare column selection signal switching means of FIG. 8.

Referring next to FIG. 9, the configuration of the spare column selection signal switching means 28 will be discussed. In the configuration of FIG. 2, only the same data can be written into both the spare memory cells and the normal memory cells since the spare column selection line used for replacing and the replaced normal column selection line are simultaneously selected. To solve that problem, in the configuration of FIG. 9, the spare column selection signal switching means 28a and 28b for forcefully setting "H" to the spare column selection signals ZSCS1 and ZSCS2 outputted from the spare column selection signal generating means 18a and 18b are provided between the spare column selection line driving circuits 6a and 6b and the spare column selection signal generating means 18a and 18b, respectively.

The spare column selection signal switching means 28a consists of an inverter 29a for inverting the output of the spare column selection signal generating means 18a and a NAND gate 30a for outputting a negative AND of an output of the inverter 29a and the test-mode signal TMC1 to the spare column selection line driving circuit 6a. Similarly, the spare column selection signal switching means 28b consists of an inverter 29b for inverting the output of the spare column selection signal generating means 18b and a NAND gate 30b for outputting a negative AND of an output of the inverter 29b and the test-mode signal TMC1 to the spare column selection line driving circuit 6b. Thus, simple addition of the spare column selection signal switching means 28a and 28b for switching the spare column selection signals to the configuration of FIG. 2 allows selection of only the normal memory cells during the test operation even after the normal memory cells are replaced by the spare memory cells.

As to row, it is also possible to achieve such a configuration as above discussed on column, which includes normal word lines and spare word lines instead of the normal column selection lines and the spare column selection lines respectively, to perform the same operation.

Figure 10:
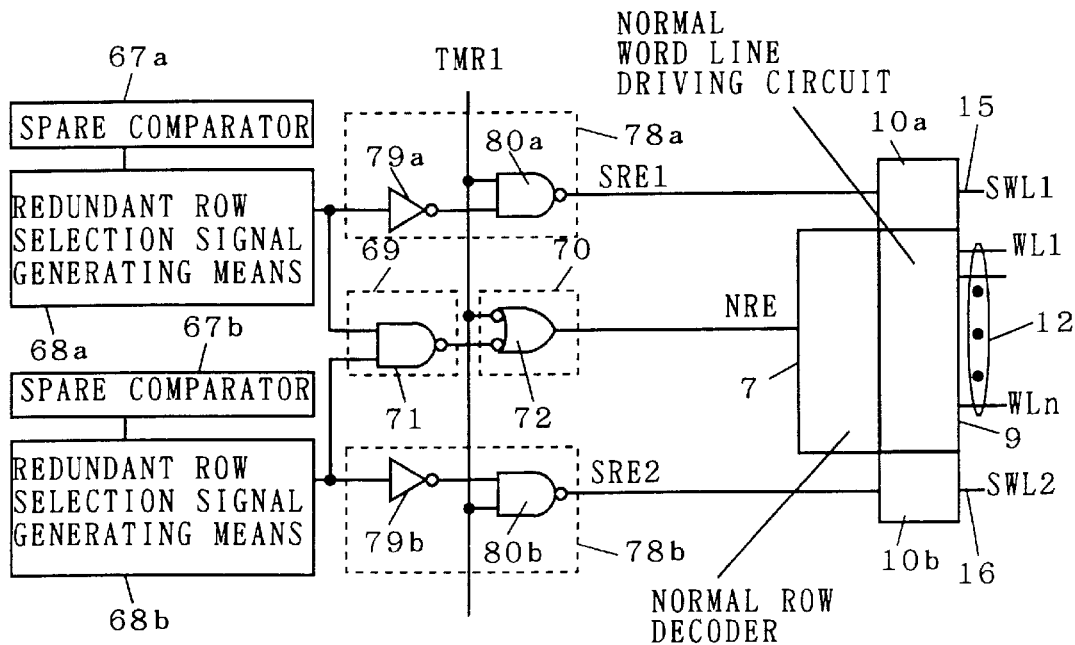
FIG. 10 is block diagram illustrating a configuration of row selection means in accordance with another aspect of the third preferred embodiment of the present invention.

Specifically, in addition to the circuit configuration of the row selection means of FIG. 4, the row selection means of FIG. 10 further includes the spare row selection signal switching means 78a and 78b.

The spare row selection signal switching means 78a and 78b include inverters 79a and 79b and NAND gates 80a and 80b, respectively, while the spare column selection signal switching means 28a and 28b include the inverters 29a and 29b and the NAND gates 30a and 30b, respectively.

The Fourth Preferred Embodiment

Figure 11:
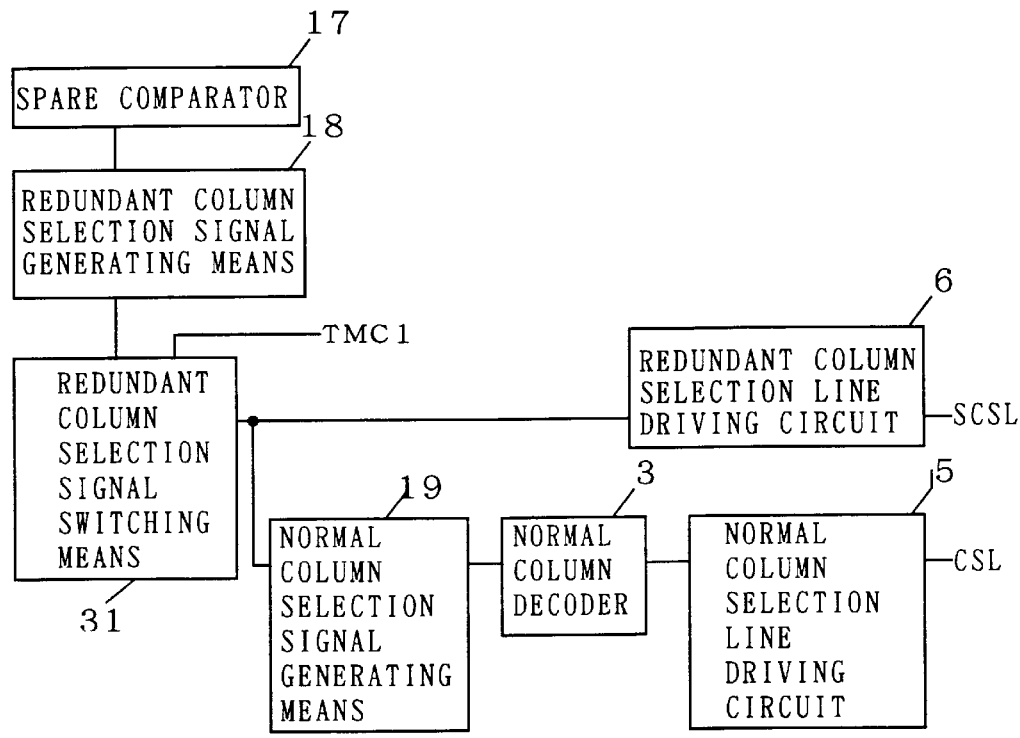
FIG. 11 is a block diagram illustrating a configuration of column selection means in accordance with a fourth preferred embodiment of the present invention.

While the column selection means of the third preferred embodiment includes the normal column selection signal switching means 20 and the spare column selection signal switching means 28, the column selection means of the fourth preferred embodiment includes spare column selection signal switching means 31 combining the functions of the normal column selection signal switching means 20 and spare column selection signal switching means 28 as shown in FIG. 11. The normal column selection signal and the spare column selection signal which are outputted from the normal column selection signal switching means 20 and the spare column selection signal switching means 28, respectively, have a complementary relation so that either the normal column selection line or the spare column selection line may become active in the test operation. On the other hand, the normal column selection signal generating means 19 makes the normal column selection line non-active while the spare column selection signal makes the spare column selection line active in the normal operation. Therefore, it is possible to combine the functions of the normal column selection signal switching means 20 and the spare column selection signal switching means 28. In order to achieve that, the column selection means is configured so that an output of the spare column selection signal switching means 31 for switching the output of the spare column selection signal generating means 18 may be supplied to the normal column selection signal generating means 19 and the spare column selection line driving circuit 6.

Figure 12:
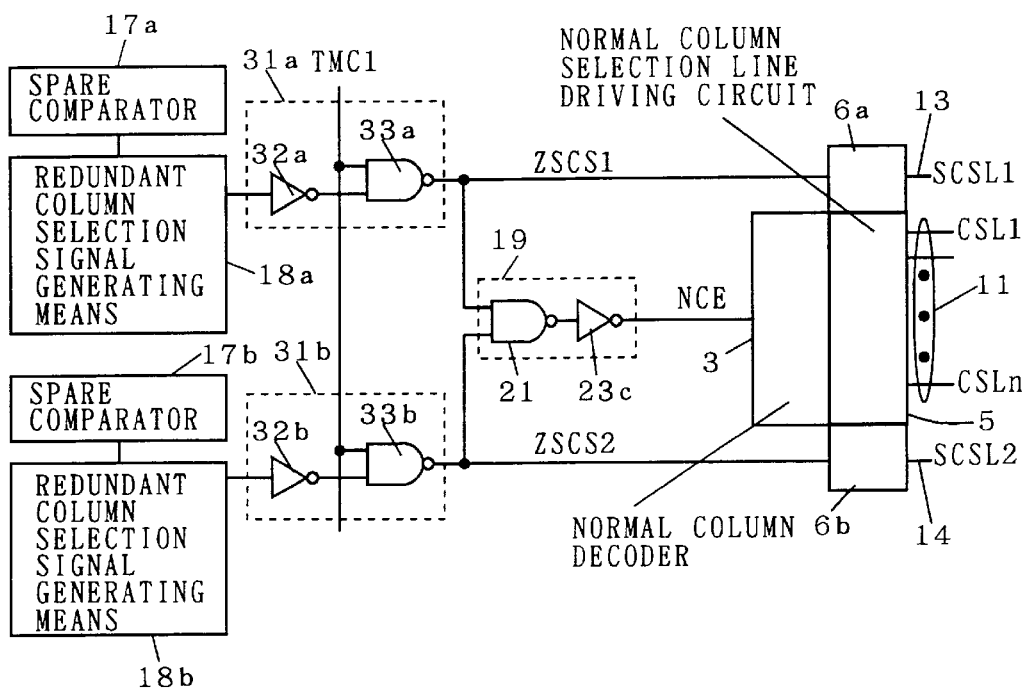
FIG. 12 is an example of circuit configuration of spare column selection signal switching means of FIG. 11.

FIG. 12 illustrates an example of circuit configuration of the spare column selection signal switching means 31 of FIG. 11. Spare column selection signal switching means 31a and 31b of FIG. 12 include inverters 32a and 32b and the NAND gates 33a and 33b respectively, like the spare column selection signal switching means 28a and 28b of FIG. 9. Accordingly, the normal column selection signal generating means 19 of FIG. 12 consists of the NAND gate 21 and the inverter 23c, like that of the background art.

Figure 13:
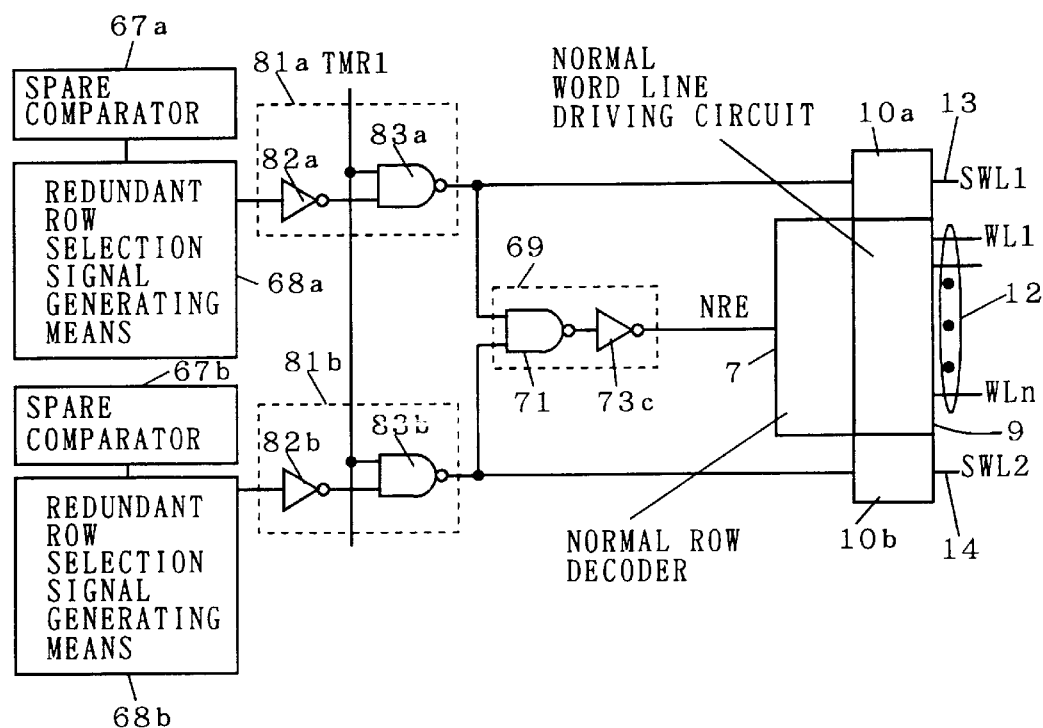
FIG. 13 is a block diagram illustrating a configuration of row selection means in accordance with another aspect of the fourth preferred embodiment of the present invention.

As to row, it is also possible to achieve such a configuration as above discussed on column, which includes normal word lines and spare word lines instead of the normal column selection lines and the spare column selection lines respectively, to perform the same operation. FIG. 13 illustrates an example of configuration of row selection means of the fourth preferred embodiment.

The Fifth Preferred Embodiment

Figure 15:
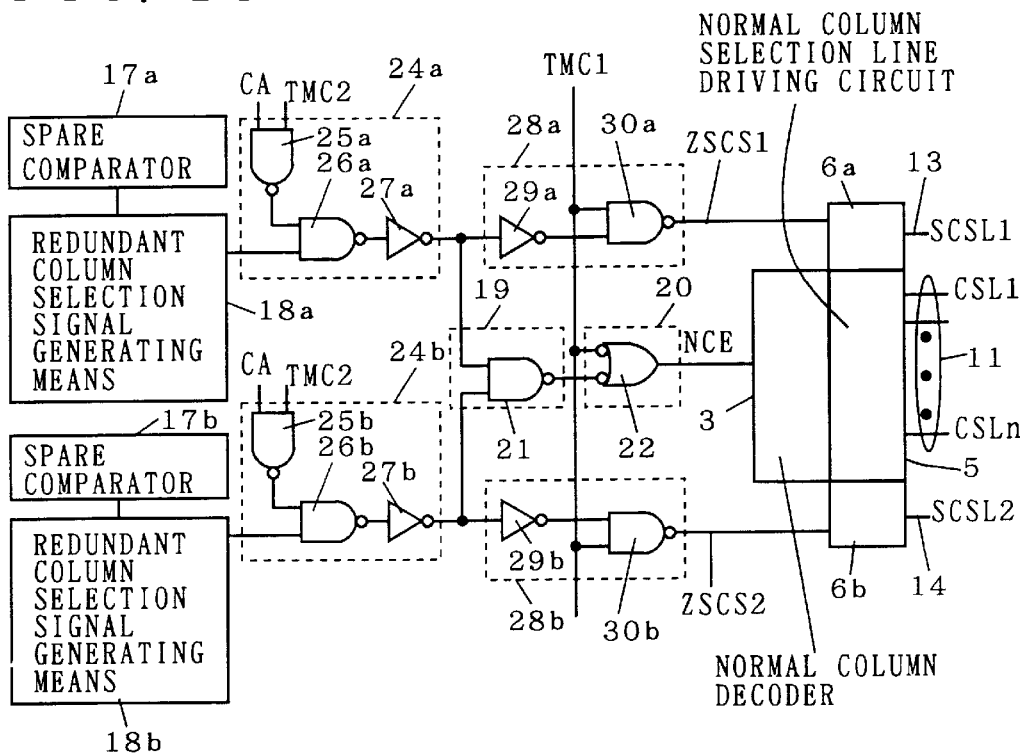
FIG. 15 is an example of circuit configuration of spare column selection signal switching means of FIG. 14.

FIG. 14 is a block diagram illustrating a configuration of column selection means in accordance with the fifth preferred embodiment of the present invention. In addition to the configuration of the column selection means of the third preferred embodiment shown in FIG. 8, the spare column selection means of FIG. 14 further includes the spare column selection signal switching means 24 of FIG. 5. In other words, the fifth preferred embodiment combines the second and third preferred embodiments. FIG. 15 illustrates an example of circuit configuration of the spare column selection signal switching means 24 of FIG. 14, the spare column selection signal switching means 28 and the normal column selection signal switching means 20. The semiconductor memory device of the fifth preferred embodiment shown in FIG. 15 produces an effect combining the respective effects of the second and third preferred embodiments.

Figure 16:
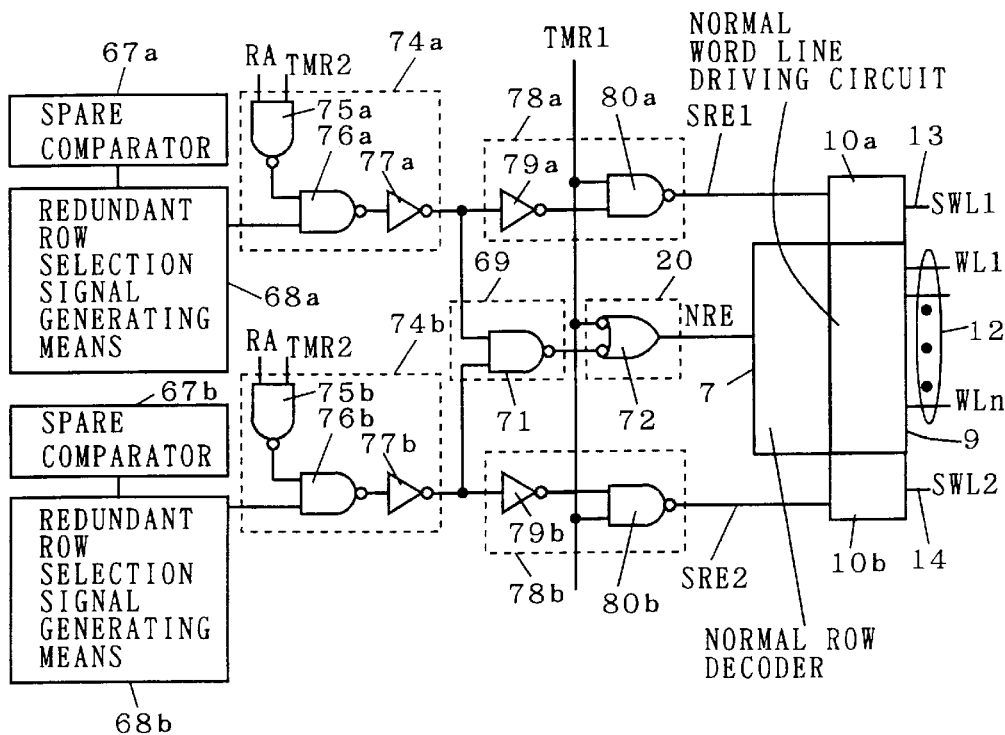
FIG. 16 is block diagram illustrating a configuration of row selection means in accordance with the fifth preferred embodiment of the present invention.

As to row, it is also possible to achieve such a configuration as above discussed on column, which includes normal word lines and spare word lines instead of the normal column selection lines and the spare column selection lines respectively, to perform the same operation. FIG. 16 illustrates an example of configuration of row selection means of the fifth preferred embodiment. Other elements correspond to those given the same reference signs in FIG. 7 or 10.

The Sixth Preferred Embodiment

Figure 17:
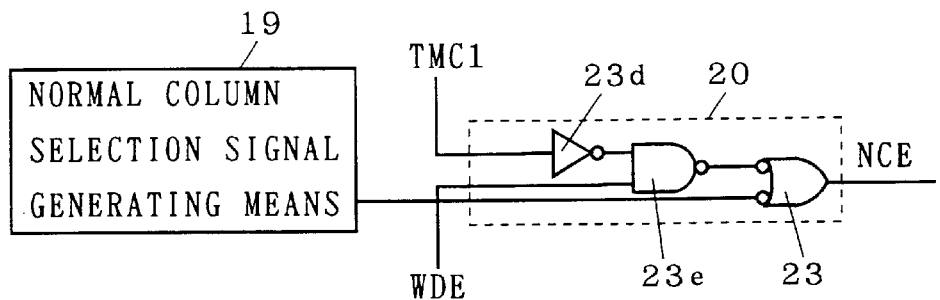
FIG. 17 is a block diagram illustrating a configuration of column selection means in accordance with a sixth preferred embodiment of the present invention.

FIG. 17 is a block diagram illustrating a configuration of column selection means in accordance with the sixth preferred embodiment of the present invention. FIG. 17 shows the configuration to control the normal column selection signal NCE by a writing-operation signal WDE in the normal column selection signal switching means 20 of the column selection means of the semiconductor memory device of the first preferred embodiment shown in FIG. 1.

The normal column selection signal switching means 20 consists of an inverter 23d for inverting the test-mode signal TMC1, a NAND gate 23e receiving an output from the inverter 23d and the writing-operation signal WDE and a NAND gate 23 receiving an output from the normal column selection signal generating means 19 and an output from the NAND gate 23e to output the normal column selection signal NCE.

In the normal operation, the test-mode signal TMC1 is "H" as discussed in the first preferred embodiment, and the NAND gate 23e outputs "H" regardless of the value of the writing-operation signal WDE. Therefore, the normal column selection signal switching means 20 performs the same operation as that discussed in the first preferred embodiment in the normal operation.

On the other hand, when the test-mode signal TMC1 is made "L", the NAND gate 23e outputs an inverted one of the writing-operation signal WDE. The writing-operation signal WDE takes "H" and "L" in a writing operation and a reading operation, respectively. Therefore, while the test mode A as discussed in the first preferred embodiment is achieved in the writing operation, the NAND gate 23e outputs "H" in the reading operation regardless of the value of the test-mode signal TMC1.

In testing the spare column selection line used for replacing the normal column selection line which is judged as defective, data are written into both the defective normal column selection line and the corresponding spare column selection line in the first preferred embodiment. Since not only writing test but also reading test is needed, it is necessary to return to the normal state out of the test mode A in the first preferred embodiment. That's because it is impossible to selectively read only the spare column selection line in the test mode.

In the sixth preferred embodiment, since the test-mode signal TMC1 becomes inoperative in the reading operation, it is possible to selectively read only the spare column selection line for test, without returning from the test mode A.

As to row, it is also possible to achieve such a configuration as above discussed on column, which includes normal word lines and spare word lines instead of the normal column selection lines and the spare column selection lines respectively, to perform the same operation.

Figure 18:
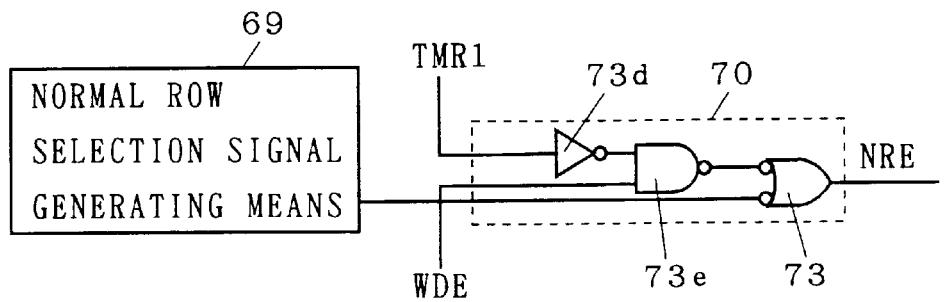
FIG. 18 is a block diagram illustrating a configuration of row selection means in accordance with another aspect of the sixth preferred embodiment of the present invention.

FIG. 18 illustrates a configuration of row selection means in accordance with another aspect of the sixth preferred embodiment. Normal row selection signal generating means 69, normal row selection signal switching means 70, NAND gates 73 and 73e, an inverter 73d and a test-mode signal TMR1 of FIG. 18 correspond to the normal column selection signal generating means 19, the normal column selection signal switching means 20, the NAND gates 23 and 23e, the inverter 23d and the test-mode signal TMC1 of FIG. 17, respectively.

The Seventh Preferred Embodiment

Figure 19:
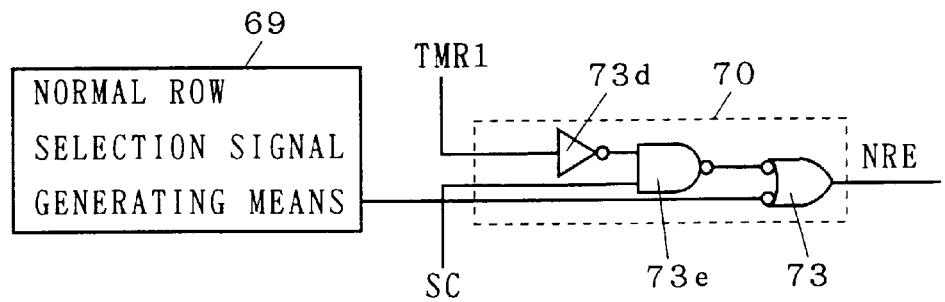
FIG. 19 is a block diagram illustrating a configuration of row selection means in accordance with a seventh preferred embodiment of the present invention.

FIG. 19 illustrates a configuration of row selection means in accordance with the seventh preferred embodiment of the present invention. The configuration of FIG. 19 is the same as that of FIG. 18, except a sensing-operation completion signal SC which is given to the NAND gate 73e instead of the writing-operation signal WDE. In other words, FIG. 19 shows the configuration to control a normal row selection signal NRE by the sensing-operation completion signal SC as well as the test-mode signal TMR1 in the normal row selection signal switching means 70 of the normal row selection means of the semiconductor memory device. The sensing-operation completion signal SC takes "L" during the sensing operation and "H" after completion of the operation. The term "during the sensing operation" refers to a transition in reading data by the sense amplifier until the potential of the bit line is determined.

In the writing operation of the test mode, the sensing-operation completion signal SC is "H", and when the selected normal row selection line is judged as defective, data are written into both the defective normal selection line and the spare row selection line used for replacing. Though the test-mode signal TMR1 is "L" indicating the test mode, the normal row selection signal NRE is determined on the basis of the output from the normal row selection signal generating means 69 until the sensing operation is completed. Therefore, from the writing operation through the reading operation, the same operation as that of the sixth preferred embodiment is performed until the sensing operation is completed.

In the sixth preferred embodiment, however, there remains a possibility that the normal row selection line which is judged as defective is not refreshed if the memory is DRAM since only the spare row selection line is read in the reading operation.

In the seventh preferred embodiment, when the sensing operation is completed, the normal row selection signal NRE is "H" regardless of the output from the normal row selection signal generating means 69 as far as the test-mode signal TRM1 is "L" indicating the test mode. Moreover, the same data are written into the normal row selection line which is judged as defective and the spare row selection line used for replacing. Therefore, the sensing operation of the spare row selection line is completed to determine the potential of the read data and thereafter the normal row selection line which is judged as defective is refreshed with the read data.

The Eighth Preferred Embodiment

Figure 20:
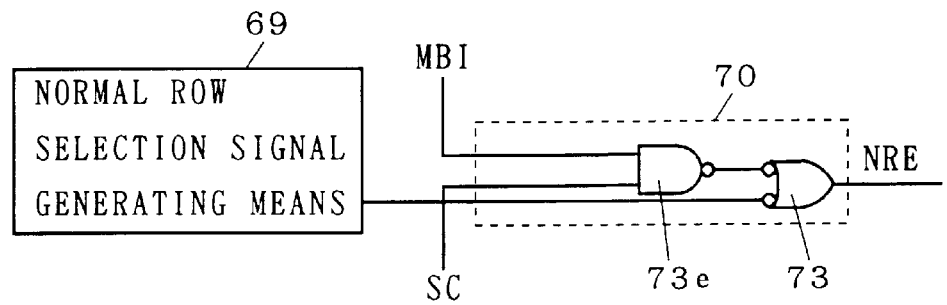
FIG. 20 is a block diagram illustrating a configuration of row selection means in accordance with an eighth preferred embodiment of the present invention.

FIG. 20 illustrates a configuration of row selection means in accordance with the eighth preferred embodiment of the present invention. FIG. 20 shows the configuration, without the inverter 73d, to give a burn-in-mode signal MBI, instead of the test-mode signal TMR1, direct to the NAND gate 73e. In other words, the configuration to control the normal row selection signal NRE by the bum-in-mode signal MBI and the sensing-operation completion signal SC in the normal row selection signal switching means 70 of the normal row selection means of the semiconductor memory device. The bum-in-mode signal MBI takes "L" in the normal operation and "H" in the bum-in operation.

NAND In the normal operation, since the NAND gate 73e outputs "H" and the NAND gate 73 serves as an inverter, the normal row selection signal NRE is determined on the basis of the output from the normal row selection signal generating means 69 regardless of the value of the sensing-operation completion signal SC. Therefore, the normal operation as discussed in the first preferred embodiment can be achieved.

On the other hand, in the burn-in operation, the sensing-operation completion signal SC takes "L" to determine the normal row selection signal NRE on the basis of the output from the normal row selection signal generating means 69 and takes "H" to forcefully make the normal row selection signal NRE "H".

Therefore, even if replacement is performed by the spare row selection line, the burn-in that applies a stress to the memory by increasing the power supply voltage as compared with the normal operation can be performed on the normal row selection line which is judged as defective.

While the invention has been shown and described in detail, the foregoing description is in all aspects illustrative and not restrictive. It is therefore understood that numerous modifications and variations can be devised without departing from the scope of the invention.

We claim:

1. A semiconductor memory comprising:

a plurality of first signal lines used to select normal memory cells;

a decoder for selecting one of said plurality of first signal lines to be active in response to an address signal;

a plurality of second signal lines each capable of being used to replace one of said plurality of first signal lines which is connected to a defective normal memory cell to select a spare memory cell for replacement of said defective normal memory cell;

a plurality of spare comparators provided correspondingly to said plurality of second signal lines, each capable of being used to detect an address signal associated with said replaced one of said plurality of first signal lines;

a plurality of spare selection signal generating means each capable of being used to generate a spare selection signal, for enabling activation of one of said plurality of second signal lines related to said address signal associated with said replaced one of said plurality of first signal lines when one of said plurality of spare comparators detects said address signal associated with said replaced one of said plurality of first signal lines;

normal selection signal generating means for generating a normal selection signal to disable said decoder so that said plurality of first signal lines do not become active when said one of said plurality of spare comparators detects said address signal associated with said replaced one of said plurality of first signal lines; and selection signal switching means for inverting said normal selection signal in response to a test-mode signal, wherein said replaced one of said plurality first signal lines is enabled to be active in response to said test-mode signal at least in a writing operation while said one of said plurality of second signal lines corresponding to said replaced one of said plurality of first signal lines is enabled to be active by one of said plurality of spare selection signal generating means in a test operation, and said replaced one of said plurality of first signal lines becomes active in response to said test-mode signal only in the writing operation.

2. The semiconductor memory device of claim 1, wherein said selection signal switching means has a first gate for outputting a signal which becomes active on detecting activation of both said test-mode signal and a writing signal by which the writing operation is performed; and a second gate for inverting said normal selection signal only when said signal outputted from said first gate becomes active.

3. A semiconductor memory, comprising:

a plurality of first signal lines used to select normal memory cells;

a decoder for selecting one of said plurality of first signal lines to be active in response to an address signal;

a plurality of second signal lines each capable of being used to replace one of said plurality of first signal lines which is connected to a defective normal memory cell to select a spare memory cell for replacement of said defective normal memory cell;

a plurality of spare comparators provided correspondingly to said plurality of second signal lines, each capable of being used to detect an address signal associated with said replaced one of said plurality of first signal lines, a plurality of spare selection signal generating means each capable of being used to generate a spare selection signal, for enabling activation of one of said plurality of second signal lines related to said address signal associated with said replaced one of said plurality of first signal lines when one of said plurality of spare comparators detects said address signal associated with said replaced one of said plurality of first signal lines;

normal selection signal generating means for generating a normal selection signal to disable said decoder so that said plurality of first signal lines do not become active when said one of said plurality of spare comparators detects said address signal associated with said replaced one of said plurality of first signal lines; and selection signal switching means for inverting said normal selection signal in response to a test-mode signal, wherein said replaced one of said plurality first signal lines is enabled to be active in response to said test-mode signal at least in a writing operation while said one of said plurality of second signal lines corresponding to said replaced one of said plurality of first signal lines is enabled to be active by one of said plurality of spare selection signal generating means in a test operation, and said replaced one of said plurality of first signal lines becomes active in response to said test-mode signal only while a sensing operation is not performed.

4. The semiconductor memory device of claim 3, wherein said selection signal switching means has a first gate for outputting a signal which becomes active on detecting activation of both a sensing-operation completion signal which becomes active on completion of said sensing operation and said test-mode signal; and a second gate for inverting said normal selection signal only when said signal outputted from said first gate becomes active.

5. A semiconductor memory, comprising:

a plurality of first signal lines used to select normal memory cells;

a decoder for selecting one of said plurality of first signal lines to be active in response to an address signal;

a plurality of second signal lines each capable of being used to replace one of said plurality of first signal lines which is connected to a defective normal memory cell to select a spare memory cell for replacement of said defective normal memory cell;

a plurality of spare comparators provided correspondingly to said plurality of second signal lines, each capable of being used to detect an address signal associated with said replaced one of said plurality of first signal lines;

a plurality of spare selection signal generating means each capable of being used to generate a spare selection signal, for enabling activation of one of said plurality of second signal lines related to said address signal associated with said replaced one of said plurality of first signal lines when one of said plurality of spare comparators detects said address signal associated with said replaced one of said plurality of first signal lines;

normal selection signal generating means for generating a normal selection signal to disable said decoder so that said plurality of first signal lines do not become active when said one of said plurality of spare comparators detects said address signal associated with said replaced one of said plurality of first signal lines; and selection signal switching means for inverting said normal selection signal in response to a test-mode signal, wherein said replaced one of said plurality first signal lines is enabled to be active in response to said test-mode signal at least in a writing operation while said one of said plurality of second signal lines corresponding to said replaced one of said plurality of first signal lines is enabled to be active by one of said plurality of spare selection signal generating means in a test operation, said replaced one of said plurality of first signal lines becomes active in response to said test-mode signal only while a sensing operation is not performed, and said test-mode signal becomes active when a burn-in test is performed.

6. The semiconductor memory device of claim 5, wherein said selection signal switching means has a first gate for outputting a signal which becomes active on detecting activation of both a sensing-operation completion signal which becomes active on completion of said sensing operation and said test-mode signal; and a second gate for inverting said normal selection signal only when said signal outputted from said first gate becomes active.

* * * * *

UNITED STATES PATENT AND TRADEMARK OFFICE
CERTIFICATE OF CORRECTION

PATENT NO.   : 6,002,621

DATED        : December 14, 1999

INVENTOR(S): Shinji TANAKA

It is certified that an error appears in the above-identified patent and that said Letters Patent is hereby corrected as shown below:

On the title page, item [19], should be:

--Tanaka--

On the title page, item [75], the inventors are incorrect. It should be:

--[75] Inventors: Shinji Tanaka; Tokyo, Japan--

Signed and Sealed this

Thirtieth Day of January, 2001

Attest:

Q. TODD DICKINSON

*Attesting Officer*                *Director of Patents and Trademarks*